United States Patent [19]

Furuya et al.

[11] Patent Number: 5,150,370

[45] Date of Patent: * Sep. 22, 1992

[54] NARROW-BAND LASER APPARATUS

[75] Inventors: Nobuaki Furuya, Kawasaki; Takuhiro Ono, Zama; Naoya Horiuchi; Keiichiro Yamanaka, both of Kawasaki; Takeo Miyata, Zama, all of Japan

[73] Assignee: Matsushita Electric Industrial Co., Ltd., Osaka, Japan

[*] Notice: The portion of the term of this patent subsequent to Jan. 15, 2008 has been disclaimed.

[21] Appl. No.: 626,145

[22] Filed: Dec. 12, 1990

Related U.S. Application Data

[63] Continuation-in-part of Ser. No. 487,080, Mar. 1, 1990, Pat. No. 4,985,898.

[30] Foreign Application Priority Data

| Jun. 14, 1989 | [JP] | Japan | 1-151789 |
| Nov. 1, 1989 | [JP] | Japan | 1-286840 |
| Jan. 12, 1990 | [JP] | Japan | 2-4984 |
| Jan. 12, 1990 | [JP] | Japan | 2-4985 |
| Jan. 12, 1990 | [JP] | Japan | 2-4986 |

[51] Int. Cl.$^5$ .............................. H01S 3/08
[52] U.S. Cl. .................. 372/106; 372/102; 372/57; 372/100
[58] Field of Search ............ 372/106, 57, 100, 102, 372/99

[56] References Cited

U.S. PATENT DOCUMENTS 3,739,295 6/1973 Shah ..................... 372/20
4,985,898 1/1991 Furuya et al. ............. 372/106

FOREIGN PATENT DOCUMENTS

| 252020 | 1/1988 | European Pat. Off. |
| 310000 | 4/1989 | European Pat. Off. |
| 63-160287 | 7/1988 | Japan. |
| 8603066 | 5/1986 | PCT Int'l Appl. |

Primary Examiner—Léon Scott, Jr.
Attorney, Agent, or Firm—Lowe, Price, LeBlanc & Becker

[57] ABSTRACT

A laser apparatus comprises an optical resonator including first and second mirrors, and laser medium. An wavelength selection element is provided in the resonator for narrowing band-width. A polarizing conversion element for changing ratio of S to P components and polarizing beam splitter are provided for amplifying laser beam to output after wavelength selection and for reducing light load of the wavelength selection element. The polarizing conversion element is provided in the resonator light path. In another embodiment, the polarizing conversion element is provided in a branch light path formed by a second polarizing conversion element and a third mirror, where the second polarizing conversion element reflects and transmits P component at a given ratio and reflects S component. The wavelength selection element comprises a Fabry-Perot etalon, grating, or prism. The polarizing conversion element comprises a quarter-wave plate or a phase retarder mirror. The polarizing beam splitting element comprises a polarizing beam splitter or polarizing beam splitting prism. Such laser apparatus is suited for an exposure light source for photolithography.

41 Claims, 26 Drawing Sheets

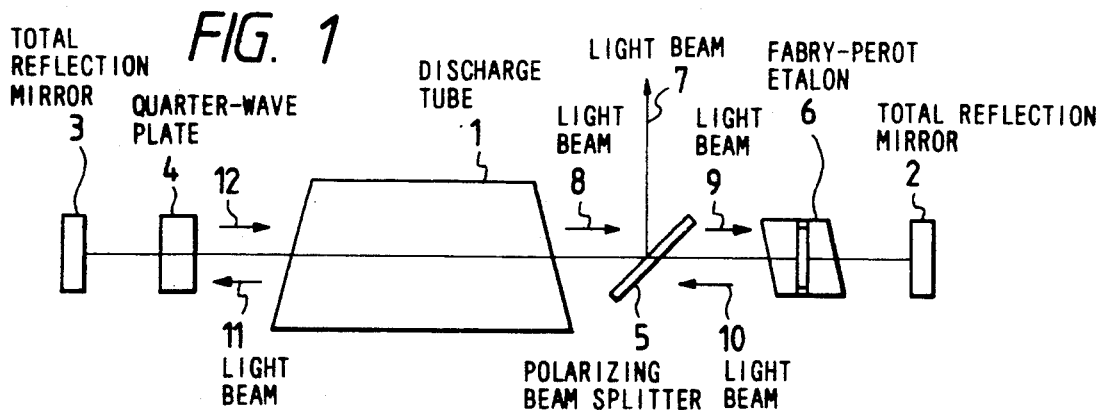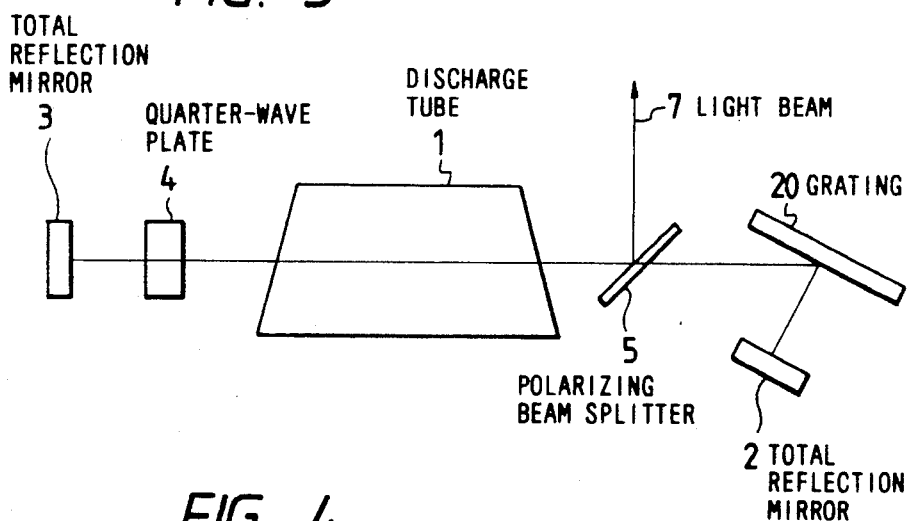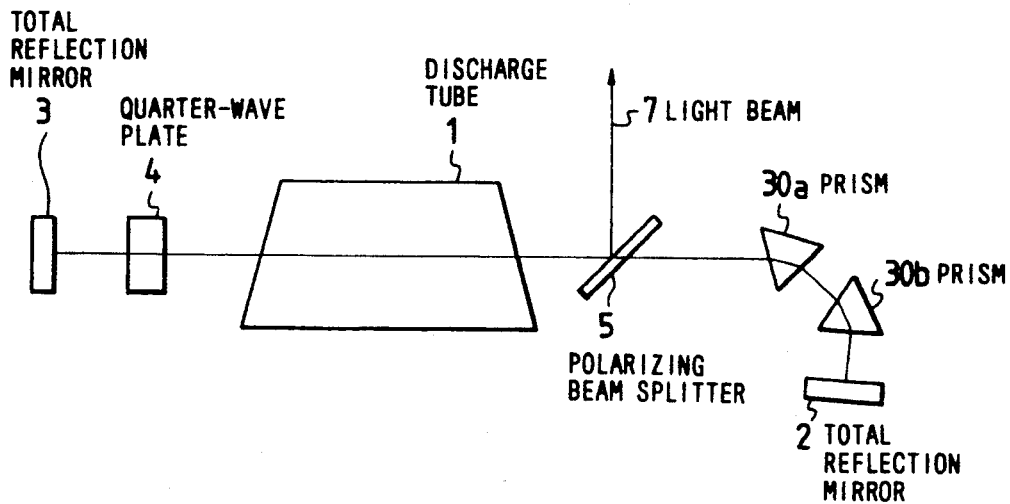

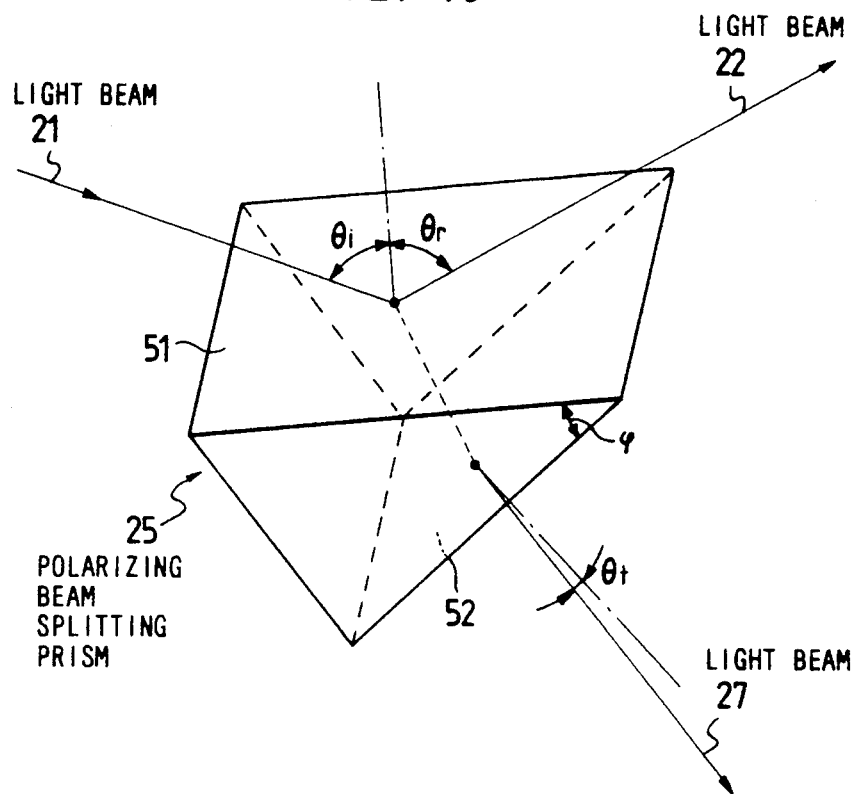
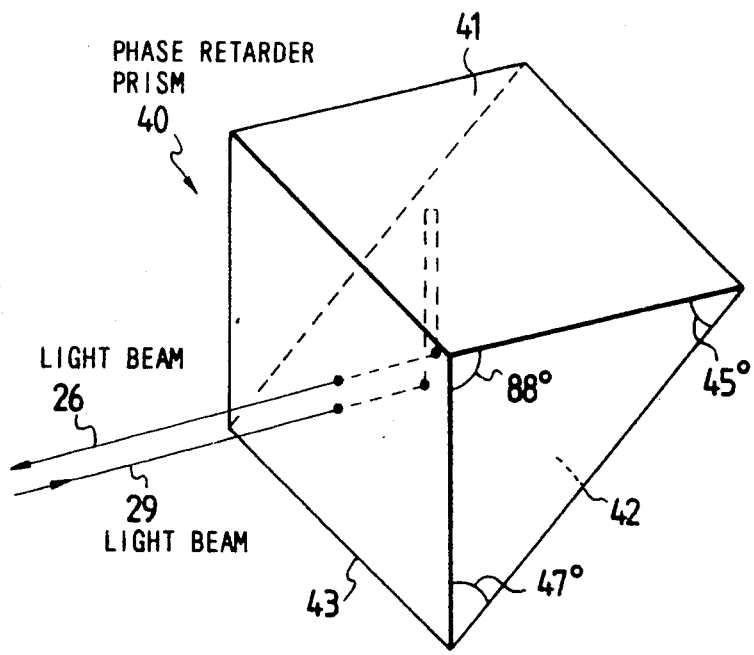

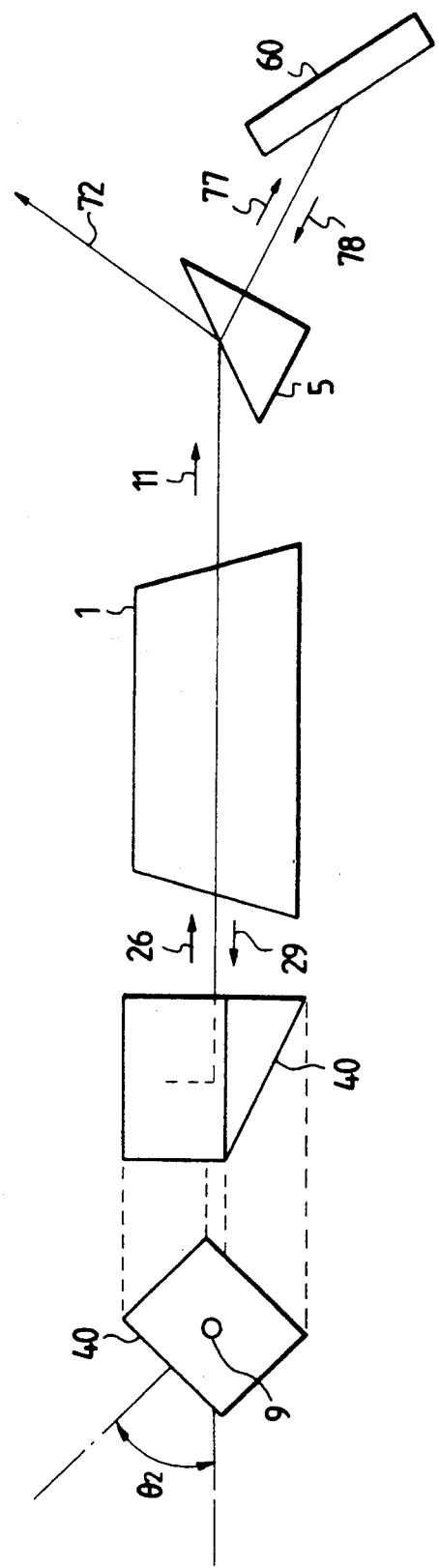

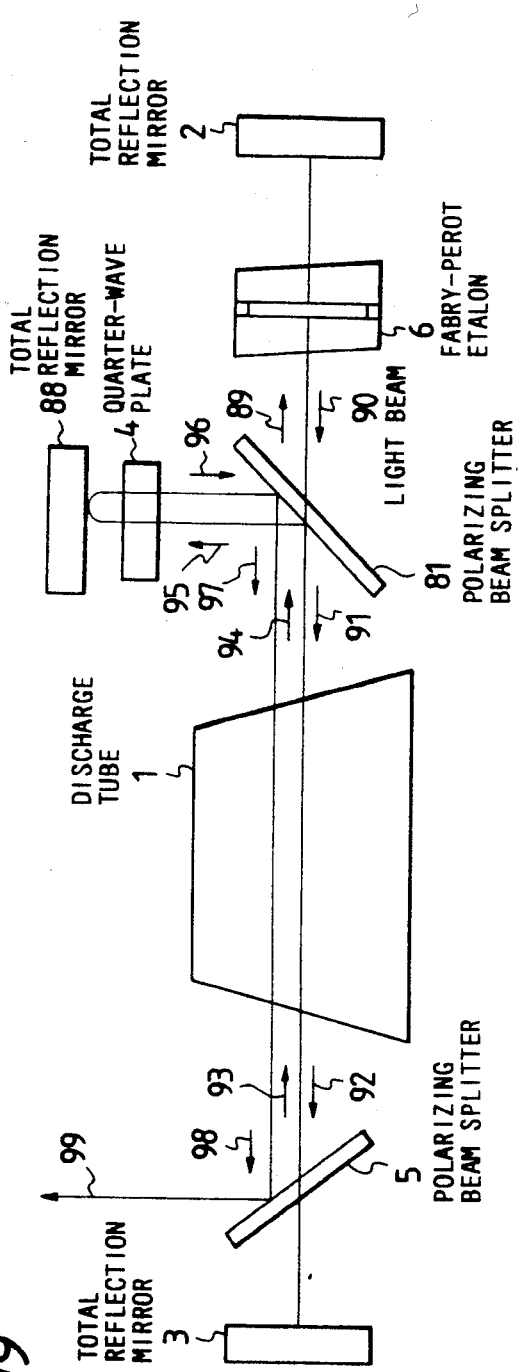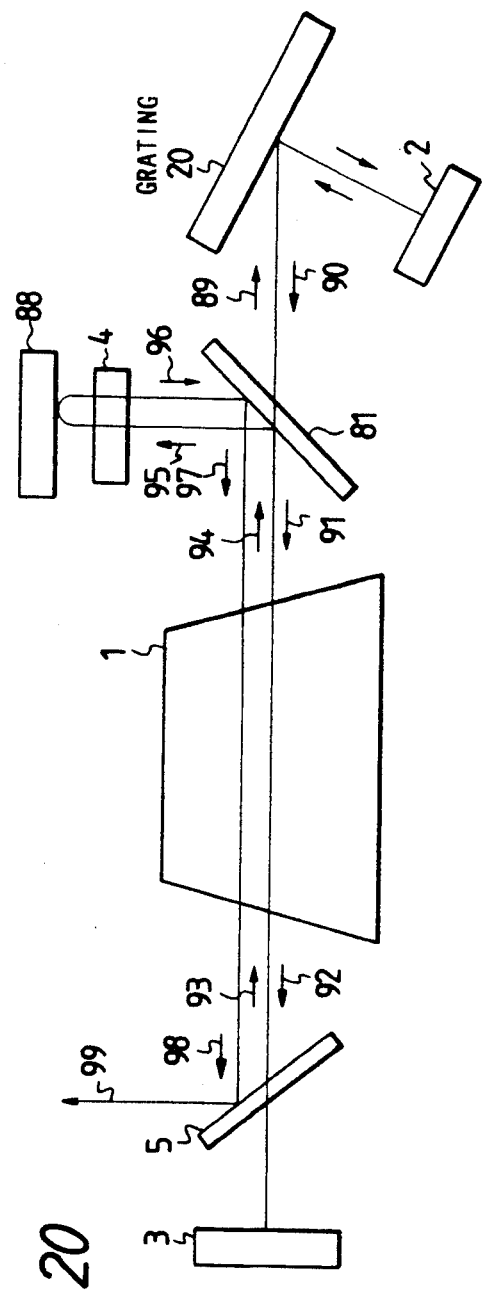

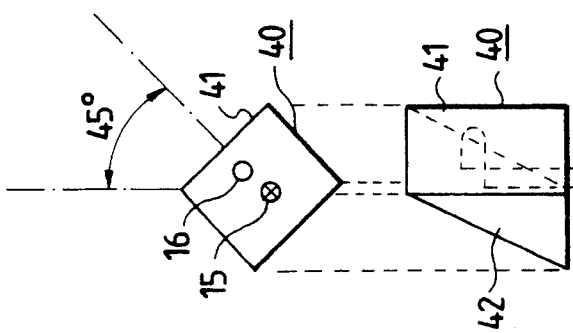
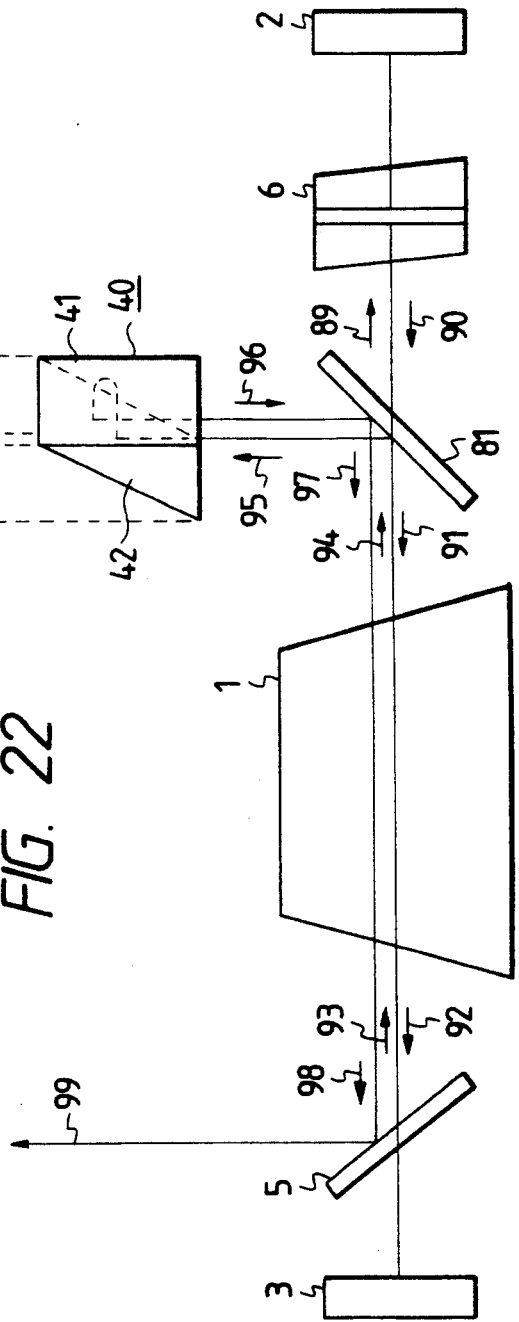
FIG. 23
FIG. 22

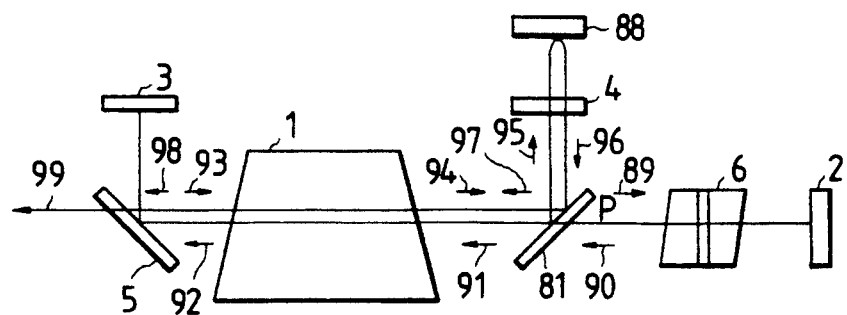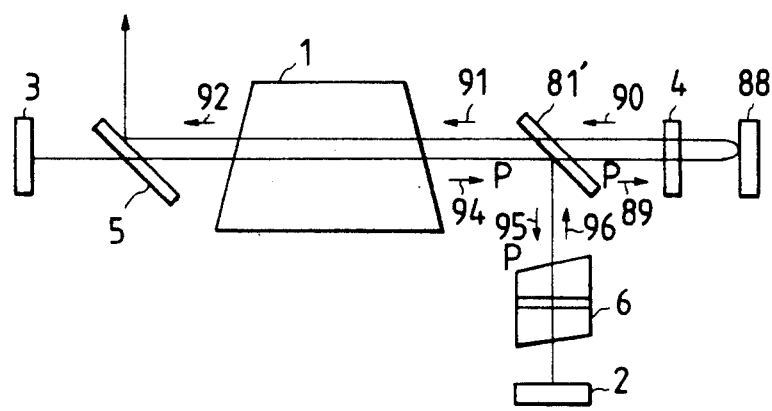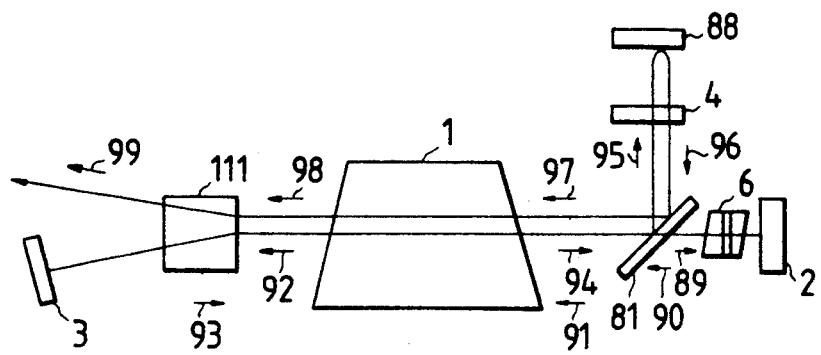

5
POLARIZING
BEAM
SPILITTER

115
CUBE TYPE
POLARIZING
BEAM
SPILITTER

111
WOLLASTON
PRISM 5   30
    PRISM

116
POLARIZING
BEAM SPLITTING
PRISM

NARROW-BAND LASER APPARATUS

This is a continuation-in-part of patent application Ser. No. 07/487,080, filed Mar. 1, 1990 now U.S. Pat. No. 4,985,898.

BACKGROUND OF THE INVENTION

1. Field of the Invention

This invention relates to a narrow-band laser apparatus.

2. Description of the Prior Art

The excimer laser has attracted attention as a light source for photolithography. The excimer laser can output a laser light beam having efficient power for exposing a photoresist film on a semiconductor wafer at several wavelengths between 353 nm to 193 nm through a laser medium comprising a noble gas, such as krypton and xenon gases, and halogen gas, such as fluorine and chlorine gases. Gain-band width of the excimer laser is approximately one nm which is too large for the exposure light source for photolithography. Band width output laser light of the excimer laser is about 0.5 nm (full width at half maximum). If such relatively broad band laser light is used as an exposing, an achromatic exposing optical system is necessary in exposing apparatus for photolithography. However, in ultraviolet region, less than 350 nm, achromatization is difficult because there are few types of optical materials which can be used for a focusing lens system. It is desired to narrow band width of the excimer laser used for the exposure light source whose band-width is around 0.005 nm. Such exposure light source enables a focusing lens system without achromatization to be used, so that simplification of the optical system of the exposing apparatus for photolithography and miniaturization and lowering cost of the exposing apparatus can be realized.

A laser apparatus for exposure which comprises an wavelength selection element provided in its optical resonator for narrowing bandwidth of laser light without attenuation of output power is described in Japanese patent application provisional publication No. 63-160287 which is described below.

FIG. 7 is a front view of the narrow-band excimer laser of the above-mentioned prior art. In FIG. 7, this prior art laser apparatus comprises an optical resonator including a total reflection mirror 102, a half mirror 103 and a discharge tube 101 provided in a light path of the optical resonator, and a Fabry-Perot etalon 104 as an wavelength selection element. In this laser apparatus, only light whose wavelength is selected by Fabry-Perot etalon 104 is amplified and oscillates, so that an extremely narrow-band laser light beam is obtained.

However in such excimer laser apparatus, there is a drawbacks that because there is high energy light continuously exists in the optical resonator, the wavelength selection element is deteriorate or deformed, so that the selection wavelength will change or output power will decrease. If such excimer laser apparatus is used as a light source for exposure, defected products of integration circuits are manufactured. In other words, maximum power of the excimer laser is limited by high-energy-light resistivity of the selection element.

SUMMARY OF THE INVENTION

The present invention has been developed in order to remove the above-described drawbacks inherent to the conventional excimer laser apparatus.

According to the present invention there is provided a narrow-band laser apparatus comprising: an optical resonator including first and second reflectors; a laser medium provided in a light path of the optical resonator for emitting light, the laser medium including an exciter; a polarizing beam splitter provided between the first reflector and the laser medium in the light path for splitting the light into a first polarizing component as an output light and a second polarized component, the polarizing beam splitter being arranged so as to direct the second component toward the first reflector; a selection element provided in the light path other that a section between the laser medium and the polarizing beam splitter for selecting a given wavelength component from the light; and a polarizing conversion element provided between the polarizing beam splitter and the second reflector in the light path for producing the first and second polarizing components in response to the light.

According to the present invention there is also provided a narrow-band laser apparatus comprising: an optical resonator including first and second reflector; a laser medium provided in a light path of the optical resonator for emitting light, the laser medium including an exciter; a first polarizing beam splitter provided between the laser medium and and the first reflector for splitting a first polarizing component of the light into one and another beams at a given ratio by transmitting and reflecting the first polarizing component and for reflecting a second polarizing component of the light, the first polarizing beam splitter being arranged so as to direct the one beam toward the first reflector; a polarizing conversion element for converting the first polarizing component of the another beamn into the second polarizing component; a third reflector for reflecting back the second polarizing component from the polarizing conversion element, the first polarizing beam splitter putting the second component into the light path by reflecting the second polarizing component; a second polarizing beam splitter provided between the laser medium and the second reflector for splitting the light into the second polarizing component as an output light and the first polarizing component, the second polarizing beam splitter being arranged so as to direct the first component toward the second reflecting means; and selecting element for selecting a given wavelength component from the light, the selecting element being provided in the light path other than a section between the laser medium and the second polarizing beam splitter.

The wavelength selection element comprises one or more Fabry-Perot etalons, gratings, or prisms. The beam polarizing conversion element comprises a quarter-wave plate, a phase retarder prism or a phase retarder mirror. The polarizing beam splitting element comprises a polarizing beam splitter or polarizing beam splitting prism. An echelle grating or echelon grating may be used in replace with the first reflection mirror and the Fabry-Perot etalon. A phase retarder mirror may be used in place with the second mirror and the wavelength phase plate. A polarizing beam splitting prism may be used as a polarizing beam splitting element and wavelength selection element in combination with a Fabry-Perot etalon.

BRIEF DESCRIPTION OF THE THE DRAWINGS

The object and features of the present invention will become more readily apparent from the following detailed description taken in conjunction with the accompanying drawings in which:

FIG. 1 is a front view of a first embodiment of a laser apparatus of the invention;

FIG. 3 is a front view of a second embodiment;

FIG. 4 is a front view of a third embodiment;

FIG. 10 is a perspective view of a portion of FIG. 9;

FIG. 11A is a front view of a sixth embodiment;

FIG. 11B is a side view of a portion of FIG. 11A;

FIG. 12 is a perspective view of a portion of FIG. 11A;

FIG. 19 is a front view of a ninth embodiment;

FIG. 20 is a front view of a tenth embodiment;

FIG. 22 is a front view of an twelfth embodiment;

FIG. 23 is a bottom view of a portion of FIG. 22;

FIG. 37 is a front view of a twenty-second embodiment;

FIG. 38 is a front view of a twenty-third embodiment;

FIG. 39 is a front view of a twenty-fourth embodiment;

The same or corresponding elements or parts are designated at like references throughout the drawings.

DETAILED DESCRIPTION OF THE INVENTION

Figure 2:
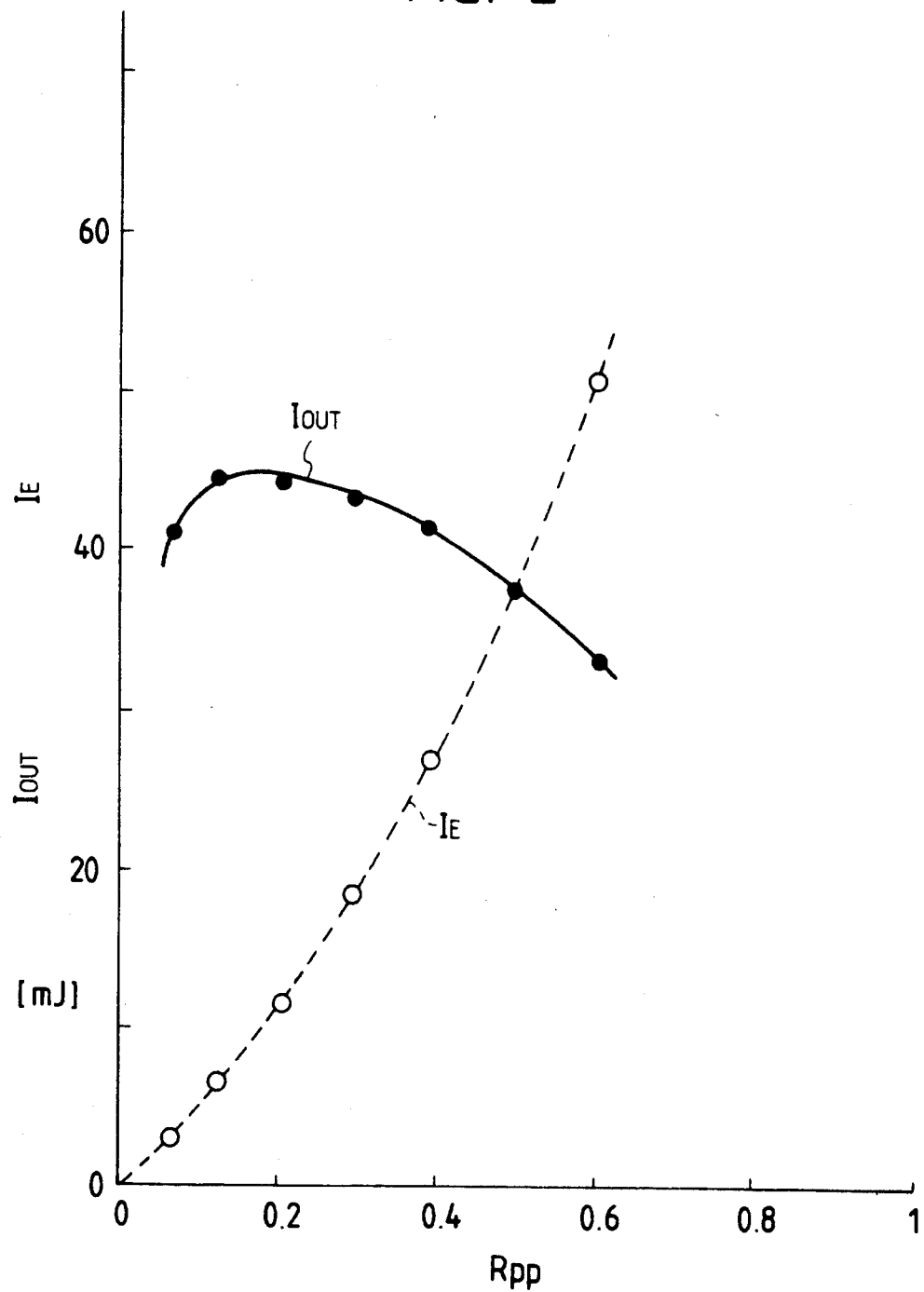
FIG. 2 is an explanatory chart of the first embodiment.

Referring now to the drawings, FIG. 1 is a front view of a first embodiment of a narrow-band excimer laser apparatus of the invention.

In FIG. 1, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is separated into one polarized light beam 7 outputted externally and another polarized light beam 9 by the polarizing beam splitter 5.

A Fabry-Perot etalon 6 as an wavelength selection element is provided between the polarizing beam splitter and the total reflection mirror 2, so that only specified narrow-band light beam is oscillated in the optical resonator.

Hereinbelow will be described operation of the laser apparatus of the first embodiment.

The light beam 8 amplified by the laser medium of the discharge tube 1 is splitted in accordance with polarized components. One polarized component is outputted as the output light beam 7. Another component light beam, i.e., a light beam 9, is transmitted through the polarizing beam splitter 5. The light beam 9 is subjected to wavelength selection by Fabry-Perot etalon 6, and then it is reflected at the total reflection mirror 2. The reflected light beam 10 is transmitted through the Fabry-Perot etalon 6 and the polarizing beam splitter 5 again and is amplified by the laser medium. The amplified light beam 11 enters the quarter-wave plate 4. The light beam 11 is transmitted through the quarter-wave plate 4 twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. Generally, it is possible to set a ratio between both polarization components of the reflected light beam 12 by changing rotational position of the quarter-wave plate 4 around the center of the axis of the light path. The reflected light 12 is amplified by the laser medium of the discharge tube 1 to produce the light beam 8. One polarization component of the light beam 8 is reflected at the polarizing beam splitter 5 as the output light beam 7. Another component is transmitted through the polarizing beam splitter 5 as the light beam 9 which maintains oscillation. Here, lasing coupling ratio of the output light beam 8 can be changed by varying ratio between intensities of the output light beam 7 and transmitted light beam 9 by rotation of the quarter-wave plate 4. As mentioned above, an intensity of the output light beam 7 is larger than that of the light beam 9 to the extent of a gain of the laser medium so that deformation and deterioration of the Fabry-Perot etalon 6 is considerably reduced.

FIG. 2 shows an experimental result showing a relationship between output laser light intensity Iout and light intensity $I_E$ at the Fabry-Perot etalon 6 of the first embodiment with respect to reflectance of P component of the polarizing beam splitters, i.e., coupling ratio for laser oscillation. The result is obtained using KrF excimer laser if FIG. 1. The mixed gas of laser medium comprises 0.22% of $F_2$, 4.4% of Kr, and remains of He. Full pressure is 1800 mb. Laser oscillation is performed by application of a supply voltage of 28 KV to the discharge tube 1. The resultant shows Iout and Fabry-Perot etalon load $I_E$ per one pulse under this condition. FIG. 8 shows another experimental result under the same condition, which shows the same relation with respect to reflectance R of a half mirror 103 of the prior art of FIG. 7. In FIG. 2, the maximum output laser light intensity Iout is about 44 mJ and at the same time, Fabry-Perot etalon load $I_E$ is about 10 mJ. On the other hand, In FIG. 8 of prior art, the maximum output laser light intensity Iout is about 14 mJ and at the same time, etalon load $I_E$ is about 23 mJ. Therefore, output light intensity Iout of the first embodiment is about three times that of the prior art of FIG. 7, on the other hand, Fabry-Perot etalon load $I_E$ is about 58% of the prior art.

In the embodiment mentioned above, Fabry-Perot etalon 6 is used as an wavelength selection element. However, other wavelength selection elements can be used. Hereinbelow will be described such structure.

Referring to FIG. 3, a second embodiment of the invention is described. In FIG. 3 which is front view of the second embodiment, structure of this embodiment is the same as that of the first embodiment expect that a grating 20 is provided in replace with Fabry-Perot etalon 6. The grating 20 as an wavelength selection element provided between the polarizing beam splitter 5 selects a given wavelength by diffraction of light and diffracted light is reflected by the total reflection mirror. Thus, the light resonating is formed by diffracted light by the grating 20. Functions of other portions are the same as the first embodiment. Thus, detailed description is omitted.

Referring to FIG. 4, a third embodiment of the invention will be described. In FIG. 4 which is a front view of the third embodiment, structure of this embodiment is the same as that of the first embodiment expect that prisms 30a and 30b are provided in replace with Fabry-Perot etalon 6. The prisms 30a and 30b provided between the polarizing beam splitter 5 and the total reflection mirror 2 select a specific wavelength by refraction of light is provided in the light path of the resonator. The resonator light path is formed total reflection mirrors 2 and 3 through the prisms 30a and 30b. Functions of other portions are the same as that of the first embodiment. Thus, detailed description is omitted.

As mentioned above, embodiments using a Fabry-Perot etalon, a grating 20, and prisms 30a and 30b as an wavelength selection element are described. When the Fabry-Perot etalon is used, it is considered that the reflection planes thereof where high energy is confined by multi-reflection between confronting reflection planes tends to be deteriorated. This is because this optical elements selects wavelength by interference between the two reflection planes confronted. On the other hand, when the grating 20 or prisms 30a and 30b described in second and third embodiments is used deterioration is reduced because wavelength selection is performed by reflection or refraction, so that high-energy-light resistivity of these elements is several times as high as that of Fabry-Perot etalon. Therefore, output power of laser beam over 20 W can be obtained according to second or third embodiment.

Figure 5:
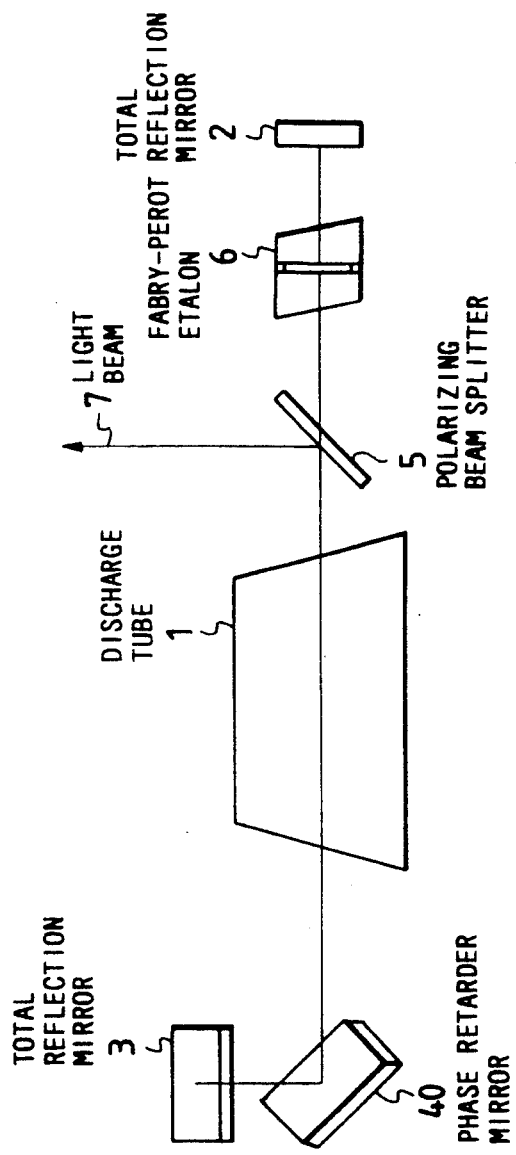
FIG. 5 is a front view of a fourth embodiment.

Referring to FIG. 5, a fourth embodiment of the invention will be described. FIG. 5 is a front view of fourth embodiment of a narrow-band laser apparatus. In FIG. 5, lasing is performed at ultraviolet region by an optical resonator comprising total reflection mirrors 2 and 3 and a discharge tube 1 including a mixed gas of noble and halogen gases as a laser medium provided between the total reflection mirrors 2 and 3. In a light path of the resonator, a phase retarder mirror 40 and polarizing beam splitter 5 are provided. The output light beam 7 amplified by the laser medium of the discharge tube 1 is outputted via the polarizing beam splitter 5. In the light path between polarizing beam splitter and total reflection mirror 2, a Fabry-Perot etalon 6 as wavelength selection element is provided so that the optical resonator allows the specified narrow-band light to run therethrough to produce a narrow-band laser beam. In the fourth embodiment, the phase retarder mirror is used in replace with the quarter-wave plate 4 used in the first embodiment. Thus, this portion will be described in detail but other portions are omitted.

Figure 6:
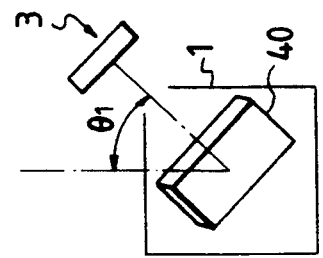
FIG. 6 is a side view of a fourth embodiment.

The phase retarder mirror 40 acts as a polarizing conversion element. The phase retarder mirror 40 comprises a dielectric thin film layer on the surface of a reflection mirror and generates S-polarized and P-polarized light having a phase difference of 90° components therebetween from obliquely incident light thereto. The phase retarder mirror 40 is provided in the light path of the optical resonator defined by the total mirrors 2 and 3 and changes directions of planes of polarization. The ratio $R_{pp}$ of P-polarization component of incident light to output P-polarization component varies with an angle $\theta_1$ (see FIG. 6 of side view) between the incident plane of the polarizing beam splitter 5 and the light path made by the phase retarder mirror 40 and the total reflection mirror 3. This ratio $R_{pp}$ changes coupling ratio for laser oscillation.

The phase retarder mirror 40 with a large diameter can be made easily; resists high-power laser beam; and produces less multi-reflection light. Thus, it is suitable for a polarizing conversion element used in the narrow-band laser apparatus for an exposure light source. A grating 20 or prisms 30a and 30b described in the second and third embodiment can be used as an wavelength selection element in this embodiment.

As mentioned above, there various types of polarizing conversion elements for producing polarizing components, each component having polarizing plane different from each other, such as Fresnel rhomboid prism, thee-time total reflection ultra-achromatic quarter-wave plate, etc. In order to obtain a large-diameter beam for exposure, a first-order or multiple-order quarter-wave plate using a crystal quartz plate is suitable. Moreover, it is necessary that quarter wave-plate is not accurate. In other words, a quarter-wave plate 4 capable of changing the ratio between polarized components S and P can be used.

Further, a multilayer cube polarizing element, a transparent plate of Brewster's angle, an Wollaston prism, etc., can be used as a polarizing beam splitting element mentioned above. In order to obtain large diameter beam for exposure, a polarization beam split mirror is excellent.

Moreover, in the above-mentioned embodiments, the wavelength selection element is provided between the polarization beam splitter 5 and the total mirror 2. However, the wavelength selection element can be provided to other position except the light path from the laser medium to the polarization beam splitter where the output laser beam is the most powerful light beam.

It is not necessary that the total reflection mirrors used in the above-mentioned embodiment have 100% reflectance but it may be a reflectance which maintains optical resonating.

Figure 9:
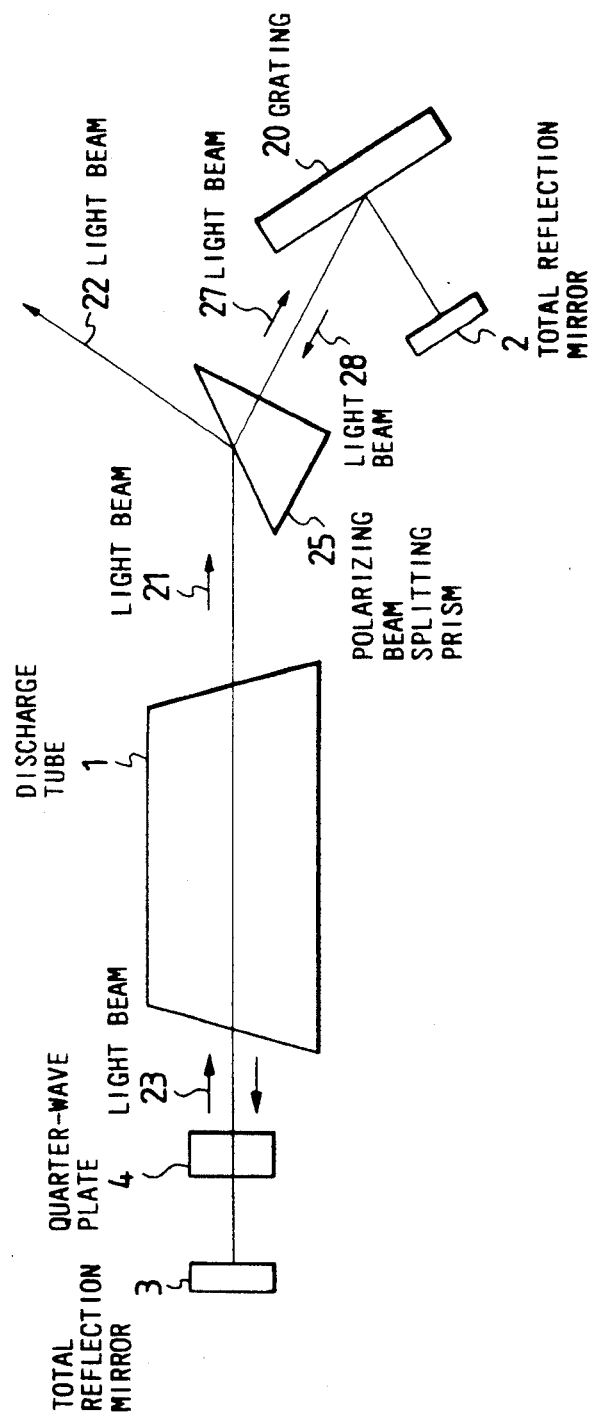
FIG. 9 is a front view of a fifth embodiment.

Hereinbelow will be described fifth embodiment. FIG. 9 is a front view of a fifth embodiment of the laser apparatus. In FIG. 9, the structure of this embodiment is the same as that of the second embodiment expect that a polarizing beam splitting prism 25 is provided in replace with the polarizing beam splitter 5. The polarizing beam spitting prism 25 separates the light beam 21 amplified by the discharge tube 1 into two beams in accordance with polarization components in the similar manner as described in the second embodiment. Functions of other portions are the same as the first embodiment. Thus, detailed description is omitted.

Light load in the grating 20 as an wavelength selection element can be reduced considerably because an intensity of the output light beam 22 is larger than that of the light beam 27 to the extent of a gain of the laser medium so that deformation and deterioration of the grating 20 is considerably reduced. More specifically, function of the polarizing beam splitting prism 25 will be described.

The polarizing beam splitting prism 25 has three combination functions. That is, the first function is separating propagation direction of a light beam in accordance with polarized component, the second function is selecting wavelength because it is a prism, and the third function is that it expands a light beam width (anamoriphic prism function). Generally, it is known that the larger the light beam 27 incident to the grating 20 is the higher wavelength selectivity the grating 20 shows because width of the light beam 27 incident to the grating 20 is expanded. As mentioned above, utilizing the polarizing prism 25 makes the above-mentioned three functions combined to simplify structure and adjusting optic axis of the apparatus, and reduces optical loss. This is because different discrete elements are not combined so that the number of optical surfaces is reduced. From the above-mentioned reasons, it is clear that there are more advantages in the case that the polarizing prism is used than in the case that a discrete polarizing separator and a conventional prism are used in combined state.

FIG. 10 is a perspective view of the above-mentioned polarizing beam splitting prism 25. Material of the prism 25 is transparent quartz or $CaF_2$ for excimer laser light and a polarizing beam splitting surface 51 is formed by dielectric multilayer on a surface 51 where the light beam 21 is incident. Generally, with selecting structure and thickness of dielectric layer, the multilayer can be formed to transmit P polarizing component and reflects S polarizing component. Thus, the polarizing beam splitting prism 25 transmits only P polarizing component of the light beam 21 and reflects S polarizing component to output a light beam 22. Anti-reflection coat surface (AR coat surface) 52 is formed on an output surface of the light beam 22. The light beam 27 exits the surface 52 at angle $\theta t$. The angle $\theta t$ is selected such that it is small compared with the incident angle $\theta i$ by selecting an apex angle $\phi$ of the prism 52. For example, $\theta i$ is selected from 50° to 85° and $\theta t$ is, from 0° to 10° approximately. This causes width of the light beam 27 to be expanded compared with that of the incident light beam 21. The light beam 28 shown in FIG. 9 advances in the opposite direction to light beams 27 and 21 through the polarizing beam splitting prism 25.

Hereinbelow will be described a sixth embodiment of the invention.

FIGS. 11A and 11B show the sixth embodiment of the invention of a narrow-band laser apparatus. FIG. 11A is front view of the narrow-band laser apparatus and FIG. 11B is left side view of a phase retarder prism. In FIGS. 11A and 11B, the phase retarder prism 40 functions as the quarter-wave plate 4 and the second total mirror 3 described in the first embodiment. The grating 60 functions as the grating 6 and the total mirror 2 of the fifth embodiment. Structure of other portions are the same as that of the fifth embodiment.

FIG. 12 is a perspective view of the phase retarder prism 40. The phase retarder prism 40 is made of high-transmittance material, such as, sythesized quartz and $CaF_2$. Anti-reflection coat surface (AR coat surface) in formed on a surface 43 where a light beam 29 enters the phase retarder prism 40 and a light beam 26 exits. Further, this surface 43 is inclined by about 2° so that the incident light beam 29 directly reflected at this surface 43 is not mixed with the output light beam 26. Thus, this prism 40 has apex angles 45°, 47°, and 88° unlike the normal type 45° prism. A surface 42 reflects the light beam at a right angle. A dielectric multilayer is formed on the surface 42, which produces P and S polarizing components having 90° phase difference therebetween in accordance with structure and thickness of dielectric layers and is optically equivalent to the quarter-wave plate 4. The light beam reflected at the surface 42 is normally reflected at a total reflection surface 41 and outputted (light beam 26) in the opposite direction. The total reflection mirror surface 41 can be formed easily by a dielectric multilayer.

As mentioned above, according to this embodiment, the phase retarder prism 40 functions as the quarter-wave plate 4 and the second total reflection mirror 3 and thus, it makes the structure of the apparatus simple and adjustment easy.

Figure 13:
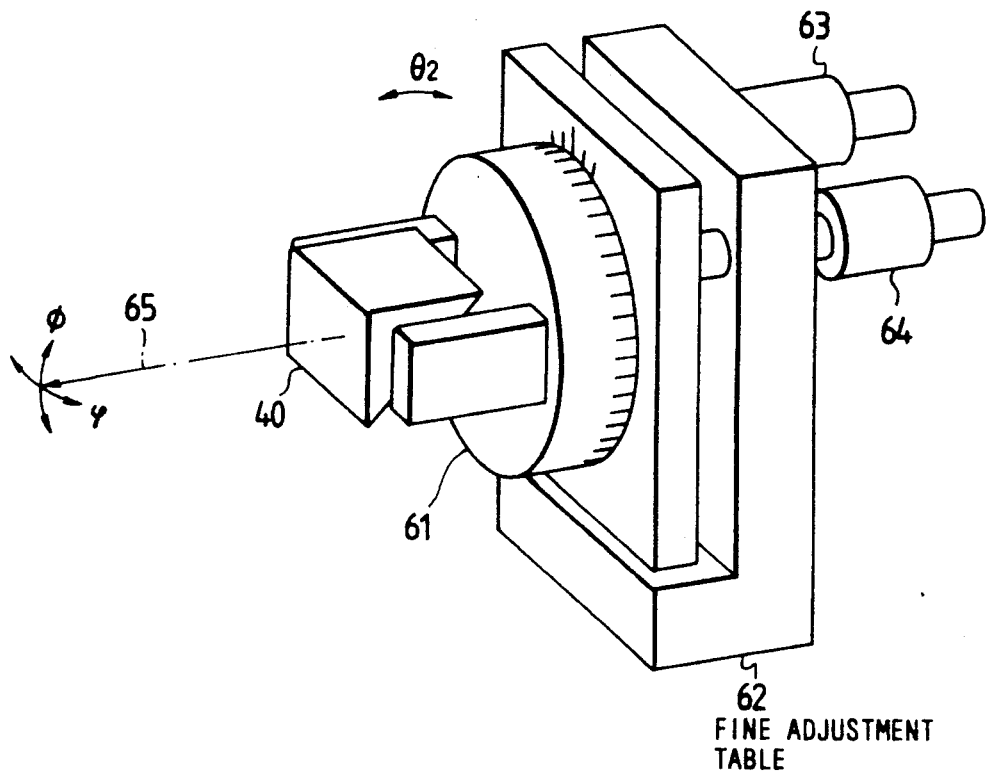
FIG. 13 is a perspective view of a mechanism of the sixth embodiment.

FIG. 13 is a perspective view of a mount for the above-mentioned phase retarder prism 40. As shown in FIG. 13, the phase retarder prism 40 is mounted on a turn table 61 which is supported by a fine adjustment table 62. Thus, the phase retarder prism 40 and the turn table can be turned with respect to a light path 65. Ratio of P to S polarizing components of the output light beam 26 of the phase retarder prism 40 can be changed by variation of the rotational angle $\theta_2$ which corresponds to $\theta_2$ shown in FIG. 11B. This adjustment is equivalent to that of variation in ratio of P to S polarizing components by the quarter-wave plate 4 of the above-mentioned first embodiment shown in FIG. 1. The fine adjustment table 62 and the phase retarder prism 40 are adjusted by fine micrometers 63 and 64 such that the optical axis of the apparatus is adjusted by fine adjustment of the angles $\theta$ and $\phi$ with respect to the light path 65.

Figure 15:
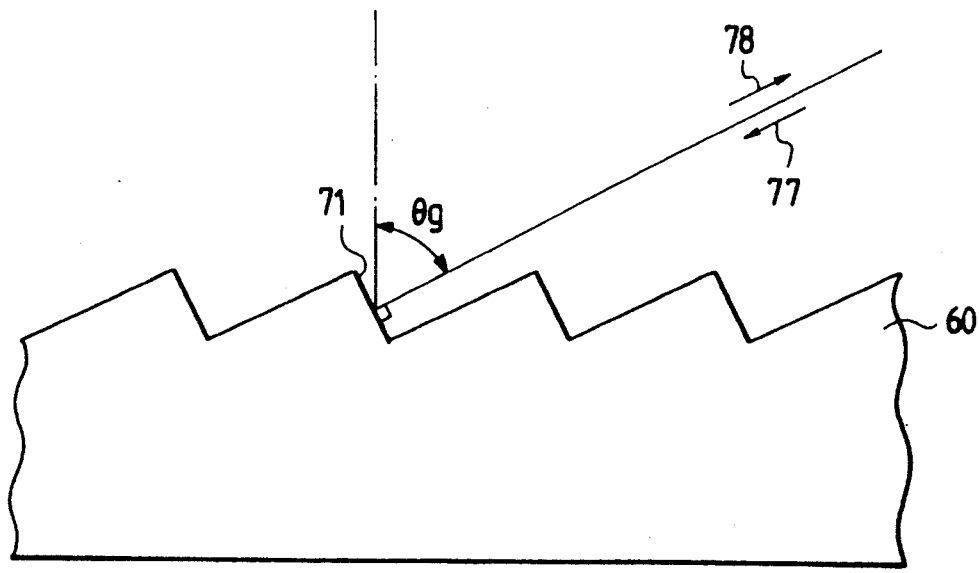
FIG. 15 is a partially enlarged front view of a grating of seventh embodiment.

The above-mentioned grating 60 shown in FIG. 11A outputs a light beam 78 such that the light path of the output light beam 78 is coincident with that of the incident light beam, such as echelle grating and echelon grating. For example, a reflection surface 61 reflects the incident light beam 77 at aright angle to output the light beam 78 as shown in FIG. 15. Such grating 60 functions as the grating 6 of the above-mentioned first embodiment shown in FIG. 1 and the first total reflection mirror 2. This structure achieves simplification in structure and provides easy adjustment.

Figure 14:
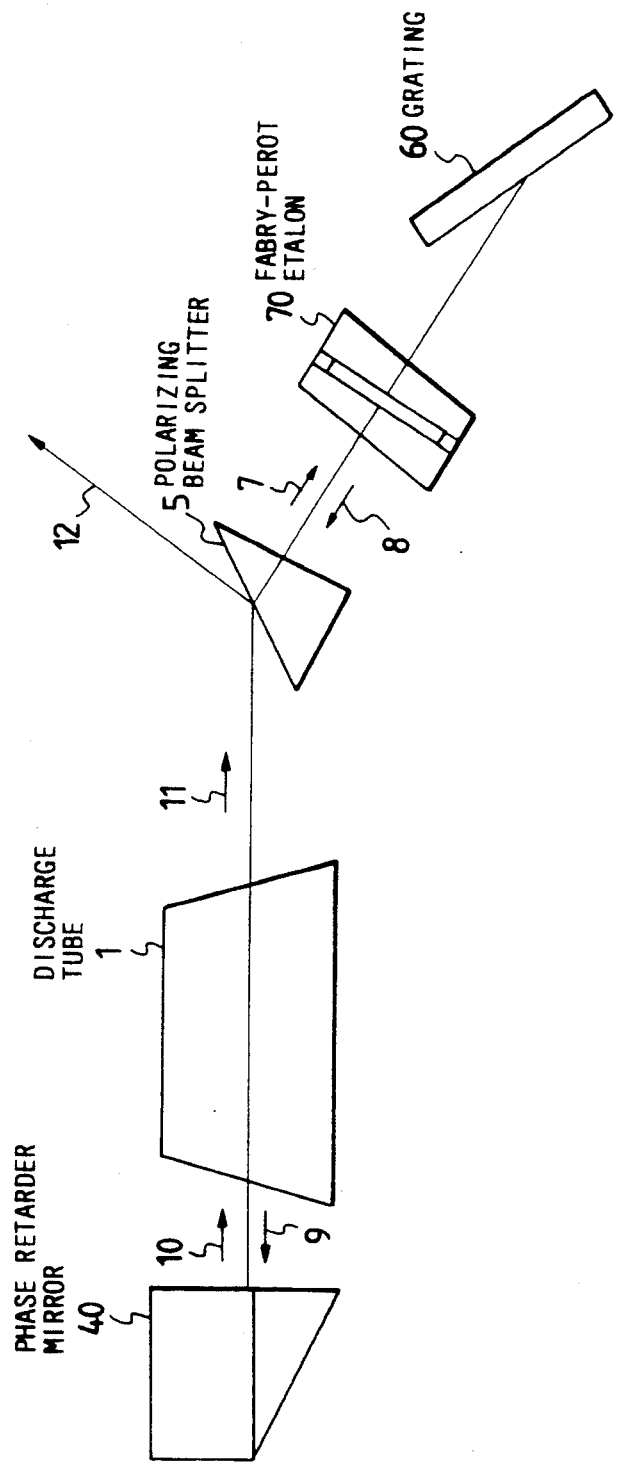
FIG. 14 is a front view of a seventh embodiment.

Hereinbelow will be described a seventh embodiment of the invention. FIG. 14 is a front view of a narrow-band laser apparatus of the seventh embodiment of the invention.

In this embodiment, a Fabry-Perot etalon 70 is used in addition to the grating 60 which functions as the grating 6 as an wavelength selection element and the first total reflection mirror 2 like the above-mentioned sixth embodiment shown in FIG. 11A. Structure of other portions are the same as that of the sixth embodiment shown in FIG. 11A. Generally, the Fabry-Perot etalon 70 has a good narrow-band selectivity compared with the grating 60. However, in the case of Fabry-Perot etalon used there is a tendency that spurious light generates because there are $n-1^{th}$ and $n+1^{th}$ oscillation around $n^{th}$ resonance oscillation. Therefore, in this embodiment, the grating 60 performs relatively coarse wavelength selection and the Fabry-Perot etalon 70, fine wavelength selection, so that it is possible to obtain laser light beam of narrow-band without spurious light. Thus, this embodiment can realize a laser apparatus which outputs a laser beam of narrow-band whose wavelength width is less than 2 pm by KrF excimer laser without decrease in output power, Moreover, it is possible to improve wavelength selectivity by using plural Fabry-Perot etalons 70.

Hereinbelow will be described an eighth embodiment of the invention.

Figure 16:
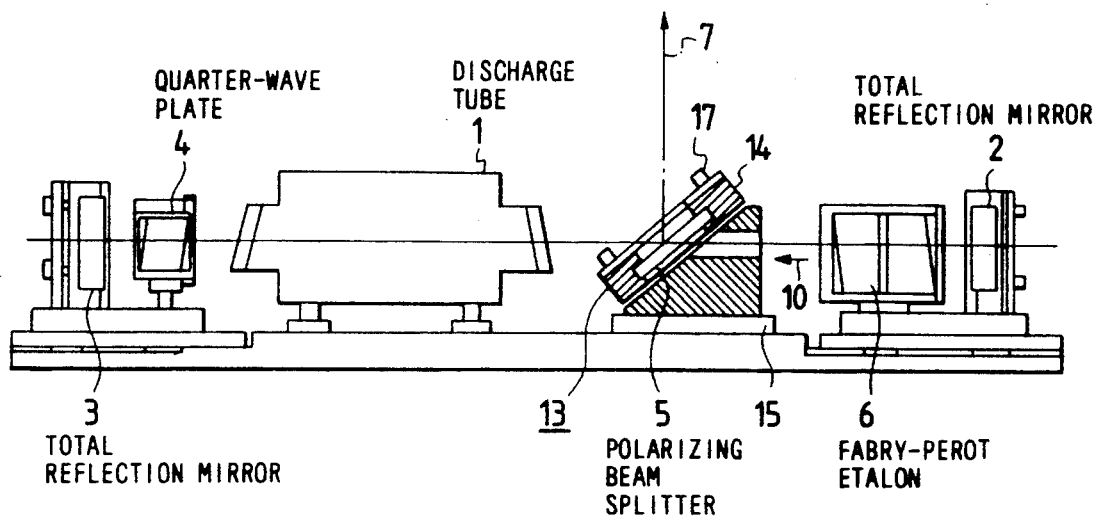
FIG. 16 is a front view of a eighth embodiment.

FIG. 16 is a front view of the eighth embodiment. The narrow-band laser apparatus of the eighth embodiment has the same structure as that of the first embodiment substantially. There is only difference in a fine adjustment mechanism of an incident angle of the polarizing beam splitter 5. This mechanism is provided for compensation of the polarizing beam splitting characteristic which varies with deviations in manufacturing the dielectric multilayer of the polarizing beam splitter 5.

It is desired that the dielectric multilayer is ideally formed. Actually, it is difficult to form dielectric multilayer film as designed. Thus, ratio of S to P polarizing components separated from the excimer laser light varies. As the result, intensity of the output light beam 7 reflected at polarizing beam splitter 5 decreases. On the other hand, loss in the light beam 10 oscillated after transmission through the polarizing beam splitter 5 and the Fabry-Perot etalon 6 as an wavelength selection element becomes larger, and load of the Fabry-Perot etalon will change largely.

Figure 17:
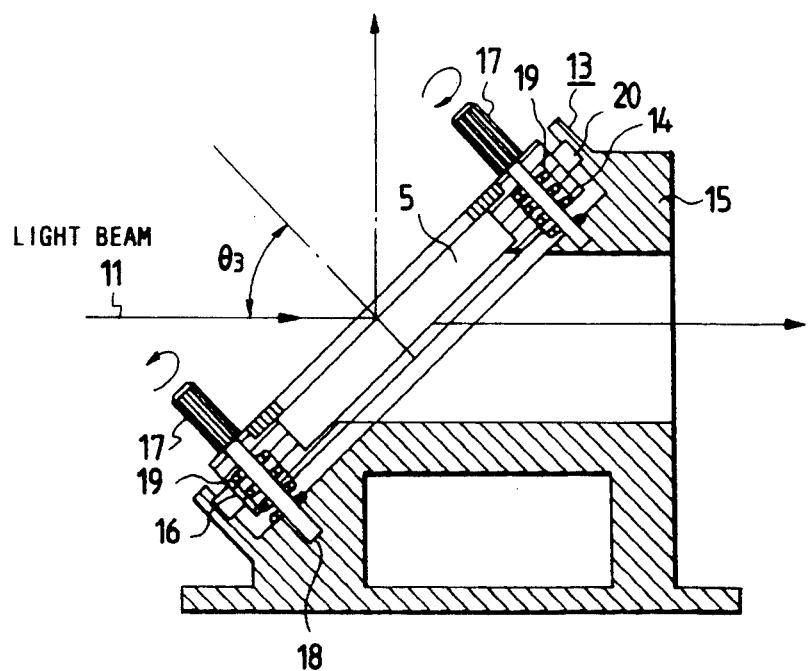
FIG. 17 is a cross-sectional view of a portion of FIG. 16.

In this embodiment, optimization of ratio between P and S polarizing components is performed such that inclination of the polarizing beam splitter 5 is changed by a fine adjustment mechanism 13 to change an incident angle of the polarizing beam splitter 5, as shown in FIGS. 16 and 17. In FIG. 16, the polarizing beam splitter 5 is fixed to a polarizing beam splitter holder 14. The polarizing beam splitter holder 14 is supported by a supporter 15 which enables angle adjustment of the polarizing beam splitter holder 14. The polarizing beam splitter holder 14 has a three adjusting screws 17 and coil springs 19 coaxially provided around the adjusting screws respectively as shown, each set of the adjusting screw 17 and coil spring 19 being provided for adjusting space between the holder 14 and the supporter 15 separately. Thus, the angle $\theta_3$ of the light beam 11 incident to the polarizing beam splitter 5 can be changed by separately turning of the adjusting screws. This causes variation of inclination angle of the polarizing beam splitter 5 and polarizing splitter holder 14 with respect to the supporter 15.

Figure 18:
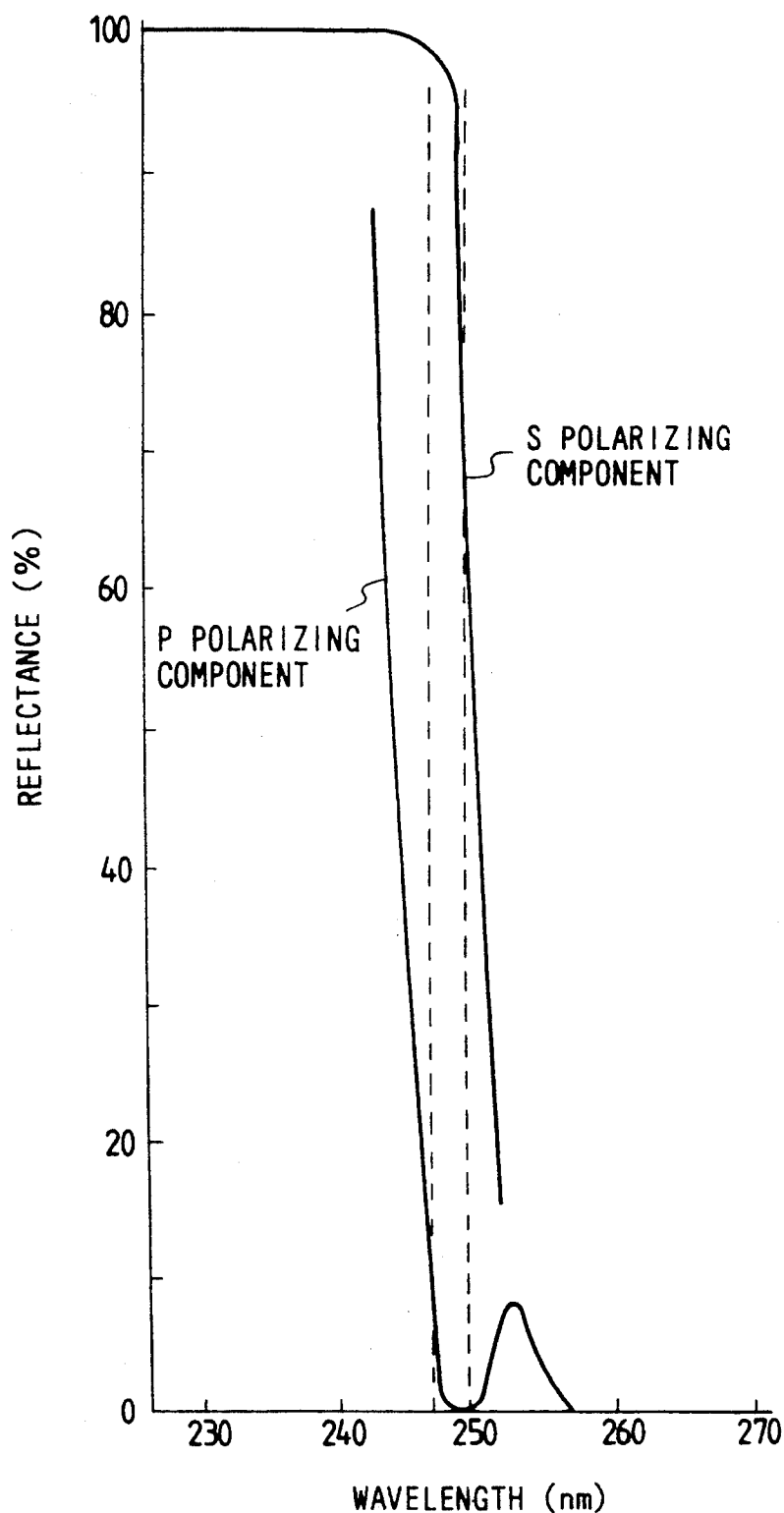
FIG. 18 is an explanatory chart of the eighth embodiment.

FIG. 18 shows a characteristic curve presenting reflectance of the polarizing beam splitter 5 on which a multilayer dielectric film is formed with respect to wavelength. Wavelength range where S polarizing component is sufficiently reflected and P polarizing component is sufficiently transmitted is narrow, as shown by dot lines in FIG. 18. In this exmaple, this wavelength range is from 247 nm to 249.3 nm. The excimer laser apparatus of KrF oscillates at 248 nm. Thus, the above-mentioned polarizing beam splitter 5 can separate polarizing beam. However, as mentioned above, if polarizing beam splitters 5 are manufactured actually, deviations in thickness of the dielectric multilayer occur so that the wavelength range showing goodbeam splitting characteristic shown by the above mentioned dot lines varies to the extent of ±several nanometers. As the result, productivity of the polarizing beam splitter 5 decreases. However, fine adjustment of the incident angle (60° in this example) within ±several degrees changes the center of the wavelength range by ±over ten nm without characteristic shown in FIG. 18 largely changed. Thus, it is possible to match in wavelength characteristic of the polarizing beam splitter 5 to the laser light beam. Thus, productivity of the polarizing beam splitter 5 is improved and this fact is a large advantage effect in actual use.

As mentioned, according to the above-mentioned embodiment, even if deviations in forming dielectric multilayer of the polarizing beam splitter 5 occur, it is possible to optimize ratio between S and P polarizing components by adjusting the incident angle the polarizing beam splitter 5 with easy operation. Further, light load of the Fabry-Perot etalon 6 as an wavelength selection element is reduced and thus, an output power of the laser apparatus is stabilized.

Hereinbelow will be described a ninth embodiment of the invention with referring to FIG. 19.

FIG. 19 is a front view of ninth embodiment of a narrow-band laser apparatus. In FIG. 19, an optical resonator comprises total reflection mirrors 2 and 3 and a discharge tube 1 is provided in the light path of the optical resonator between the total reflection mirrors 2 and 3 which includes a mixed gas of noble and halogen gases as a laser medium. When the discharge tube 1 is excited, a laser beam of ultraviolet is generated there. In a light path of the resonator a polarizing beam splitter 81 is provided between the discharge tube 1 and the first total reflection mirror 2. A polarizing beam splitter 5 is provided between the discharge tube 1 and the second total reflection mirror 3. The polarizing beam splitter 81 separates propagation directions of light beams having different polarizing components. However, a portion of one polarizing component is reflected at the polarizing beam splitter 81 and other portion is transmitted through the polarizing beam splitter. For example, the polarizing beam splitter 81 reflects 100% of S polarizing component but transmits a ratio T of P polarizing component and reflects a ratio (1−T) of P polarizing component. The ratio T ranges from 0.005 to 0.8 approximately. The polarizing beam splitter 5 separates propagation direction of light beams of different polarizing directions. For example, it transmits 100% of P polarizing light and reflects 100% of S polarizing light. A Fabry-Perot etalon 6 is provided between the polarizing beam splitter 81 and the first total reflection mirror 2 as an wavelength selection element. A quarter-wave plate 4 and a third total reflection mirror are provided in the light path separated at the polarizing beam splitter 81, i.e., the light path other than the light path of the resonator for maintaining oscillation.

Hereinbelow will be described operation of the above-mentioned embodiment.

The polarizing beam splitter 81 transmits amplified P polarized beam 14 incident thereto partially. The transmitted P polarized light beam 89 enters the Fabry-Perot etalon 6 as an wavelength selection element, which selects only a given wavelength component from the light beam 89. Then the light beam transmitted through the Fabry-Perot etalon 6 is reflected at the first total mirror 2. The polarizing beam splitter 81 transmits a portion of the light beam 90 (a light beam 91) because the light beam 90 is a P polarizing beam. The discharge tube 1 amplifies the light beam 91 to output a light beam 92. The polarizing beam splitter 5 transmits the light beam 92 because the light beam 12 is P polarized. The transmitted light beam is reflected at the second total reflection mirror 3 and then is transmitted through the polarizing beam splitter 5 again as a light beam 93. The light beam 93 is amplified by the discharge tube 1 to output a light beam 94. A portion of the light beam 94 transmits the polarizing beam splitter 81 as a light beam 89 which maintains oscillation in the similar manner mentioned earlier. Other portion of the light beam 94 is reflected at the polarizing beam splitter 81 as a light beam 95. The light beam 95 is transmitted through the quarter-wave plate 4. The transmitted light beam is reflected at the third total mirror 8 and transmits the quarter-wave plate 4 again where P polarizing beam is converted into S polarizing beam, i.e., a light beam 96. This twice transmitting through the quarter-wave plate 4 is equivalent to one transmitting though a half-wave plate. It is known that if an optical axis of the quarter-wave plate 4 is set such that its optical angle has an inclination angle 45° with respect to polarizing plane of the incident light, the P polarized incident light is converted into S polarizing light totally.

The polarizing beam splitter 81 reflects 100% of S polarizing light beam 96 to produce S polarizing light beam 97 which is amplified by the discharge tube 1. The amplified S polarizing light beam 98 is reflected 100% at the polarizing beam splitter 5 entirely to output S polarizing output light beam 99.

As mentioned above, deformation and deterioration of the Fabry-Perot etalon 6 decreases considerably because an intensity of the output light beam 99 is larger than that of the light beam 89 incident to the Fabry-Perot etalon 6 by the gain of the laser medium, i.e., the output light beam is taken out after amplifying by the discharge tube 1. Deformation and deterioration of the Fabry-Perot etalon 6 in this embodiment decrease further compared with the first embodiment because the light beam 90 whose wavelength is selected is amplified by the dishcarge tube 1 three times, on the other hand, the light beam 10 whose wavelength is selected is amplified twice.

Figure 26:
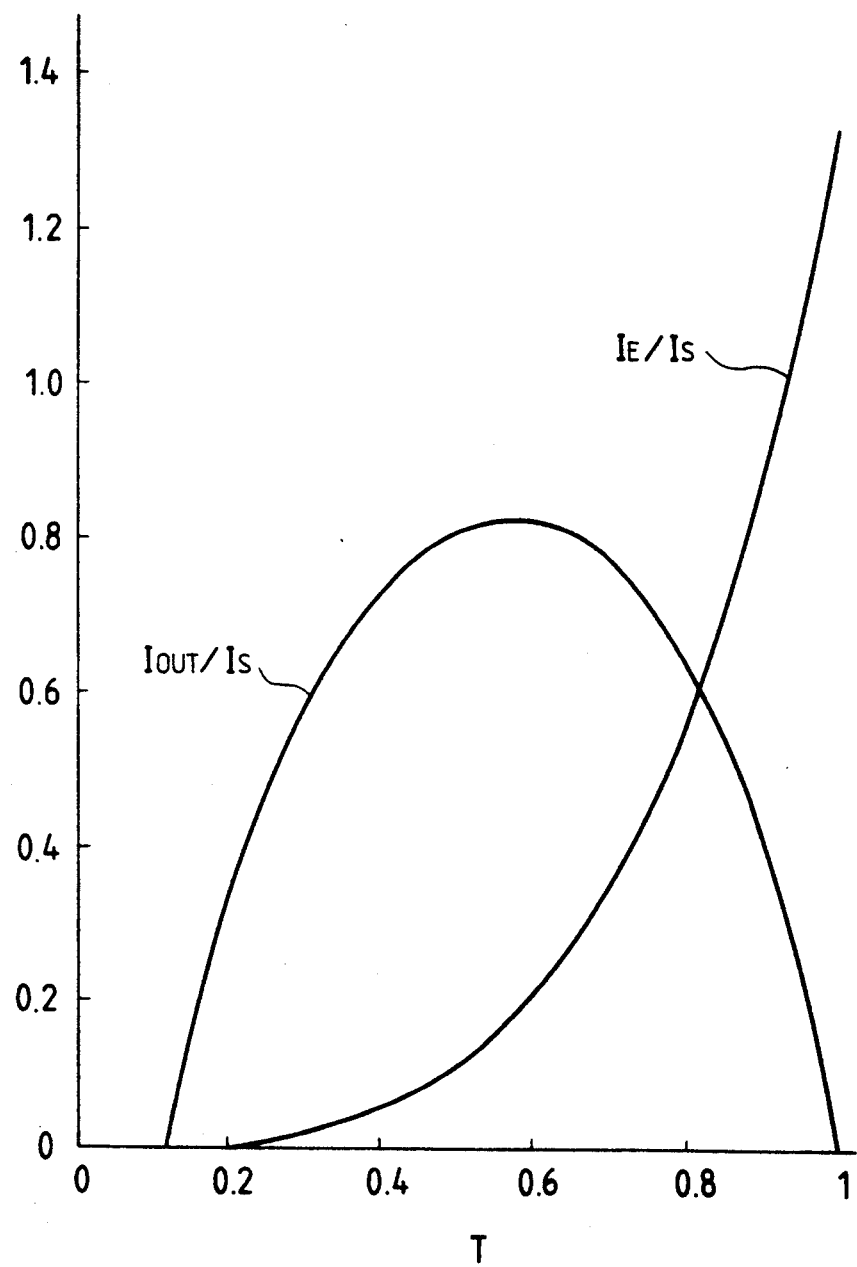
FIG. 26 shows calculation results showing relationship between light intensity of output light beam and light intensity of the beam 89.

FIG. 26 shows calculation results showing relationship between light intensity of output light beam and light intensity of the beam 89 as light load of the Fabry-Perot etalon 6 with respect to transmittance of P component in the polarizing beam splitter 81. This result is obtained by equations described at "Saturation Effects in High-Gain Lasers" by W. W. RIGROD, Journal of Applied Physics, Vol. 36, No. P2487-p2490, August 1965 (Eqs. 7 and 11 of the document). The results show output light intensity Iout/Is and etalon load light intensity $I_E/Is$ which are normalized by saturation light intensity Is with respect to transmittance of P polarizing light beam of polarizing beam splitter 8.

Figure 7:
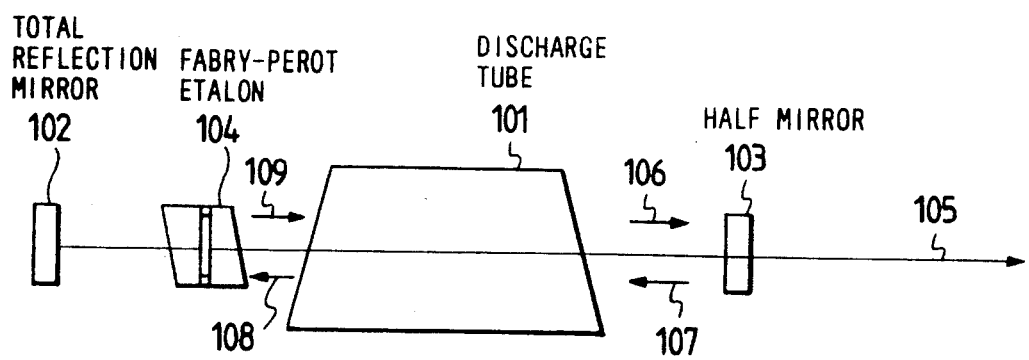
FIG. 7 is a front view of a prior art laser apparatus.
Figure 8:
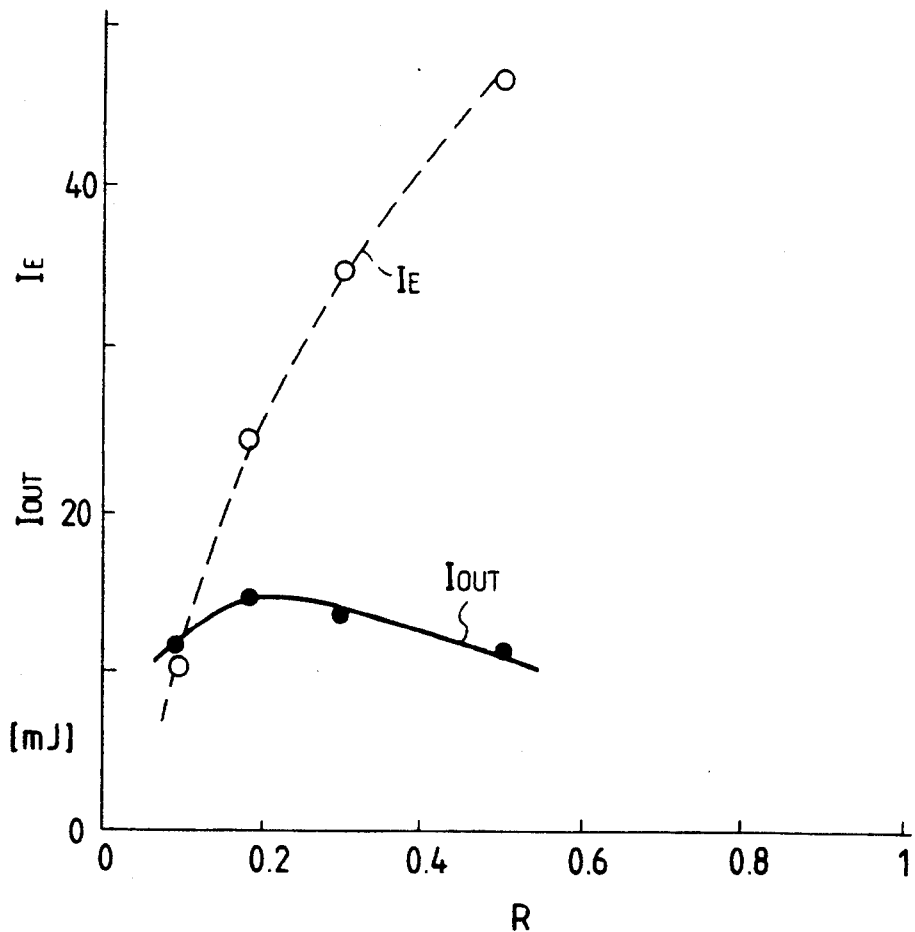
FIG. 8 is an explanatory chart of the prior art.
Figure 27:
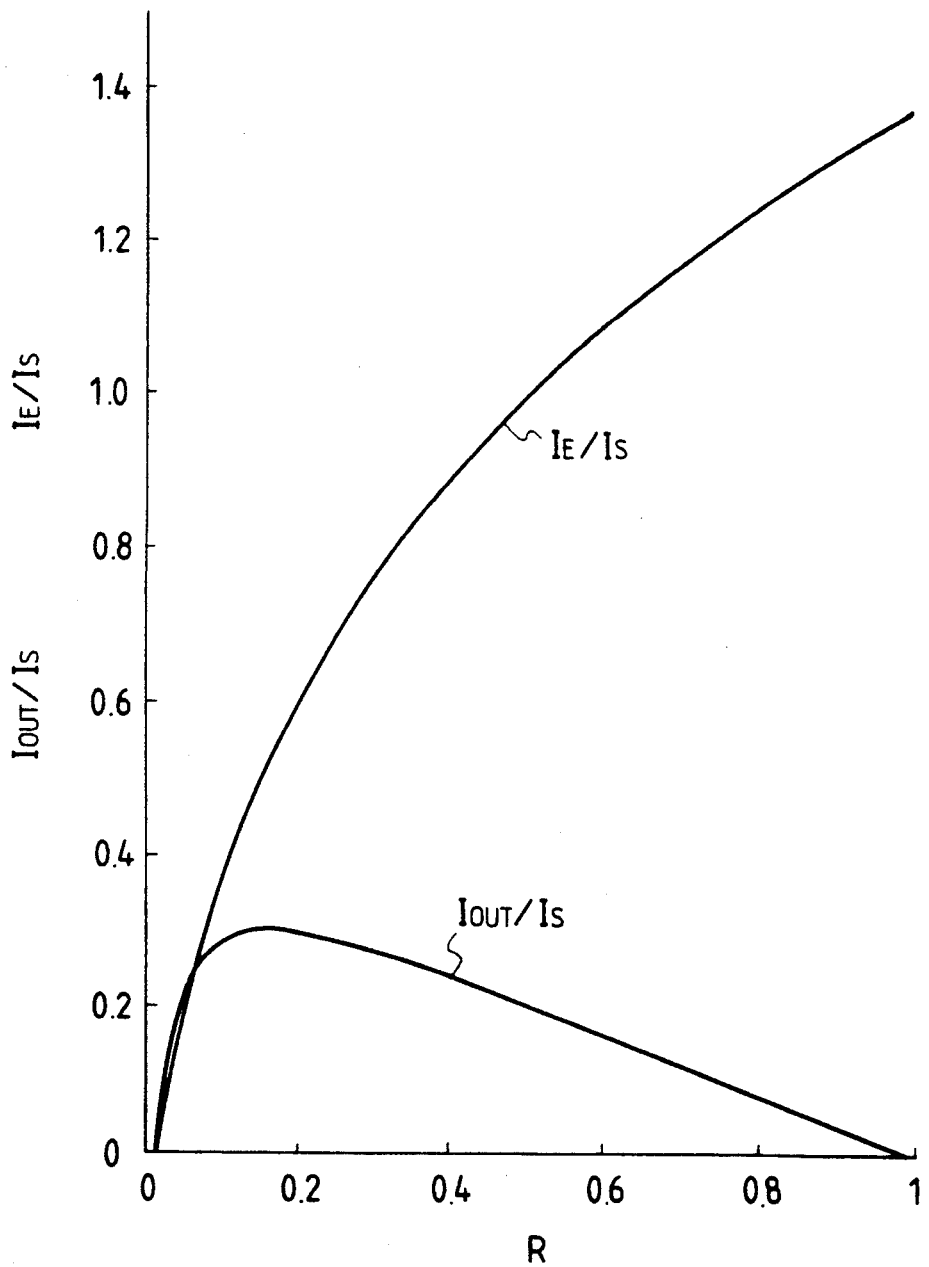
FIG. 27 shows calculation results showing relationship between light intensity of output light beam and light intensity of the beam 108.

FIG. 27 shows calculation results showing relationship betweenn light intensity of output light beam and light intensity of the beam 108 as light load of the Fabry-Perot etalon 104 of the prior art of FIG. 7. This result is obtained by the equations of the above-mentioned document. The results show output light intensity Iout/Is and etalon load light intensity $I_E/Is$ which are normalized by saturation light intensity Is with respect to reflectance R of the half mirror 103.

Comparing the result shown in FIG. 26 of the embodiment of the invention with the result shown in FIG. 27 of the prior art, it is clear that the embodiment of the invention can output the same Iout with smaller value $I_E$ than that of the prior art of FIG. 7. In other words, in FIG. 26, when Iout/Is=0.3, $I_E/Is=0.004$, on the other hand, in FIG. 27, $I_E/Is=0.41$ where the later is more than hundred times the former. Therefore, light intensity of incident light to the Fabry-Perot etalon 6 is reduced considerably. Moreover, there is a remarkable feature as follows:

In FIG. 27 of the prior art, when a value of R is 0.15, the maximum output value Iout/Is=0.31 is obtained. On the other hand, in the embodiment of the present invention, when T=0.58, the maximum output Iout/Is=0.83 is obtained. Thus, the output power of the invention is 2.7 times that of the prior art. That indicates the laser apparatus of the invention is excellent as a laser apparatus.

As mentioned above, in this embodiment, light energy transmitted through the Fabry-Perot etalon 6 is largely reduced and a narrow-band laser apparatus showing an excellent characteristic of output efficiency.

The above-mentioned embodiment is described using Fabry-Perot etalon 6 as an wavelength selection element. However, other wavelength selection elements can be applied to this invention. Hereinbelow will be described other embodiments using such elements.

Referring to FIG. 20, a tenth embodiment of the invention is described. In FIG. 20 which is front view of the tenth embodiment, the structure of this embodiment is the same as that of the ninth embodiment expect that a grating 20 is provided in replace with Fabry-Perot etalon 6.

The grating 20 as an wavelength selection element provided between the polarizing beam splitter 5 and the total reflection mirror 2 selects a specified wavelength. Thus, the light resonating is formed by diffracted light by the grating 20. Functions of other portions are the same as the ninth embodiment. Thus, detailed description is omitted.

Figure 21:
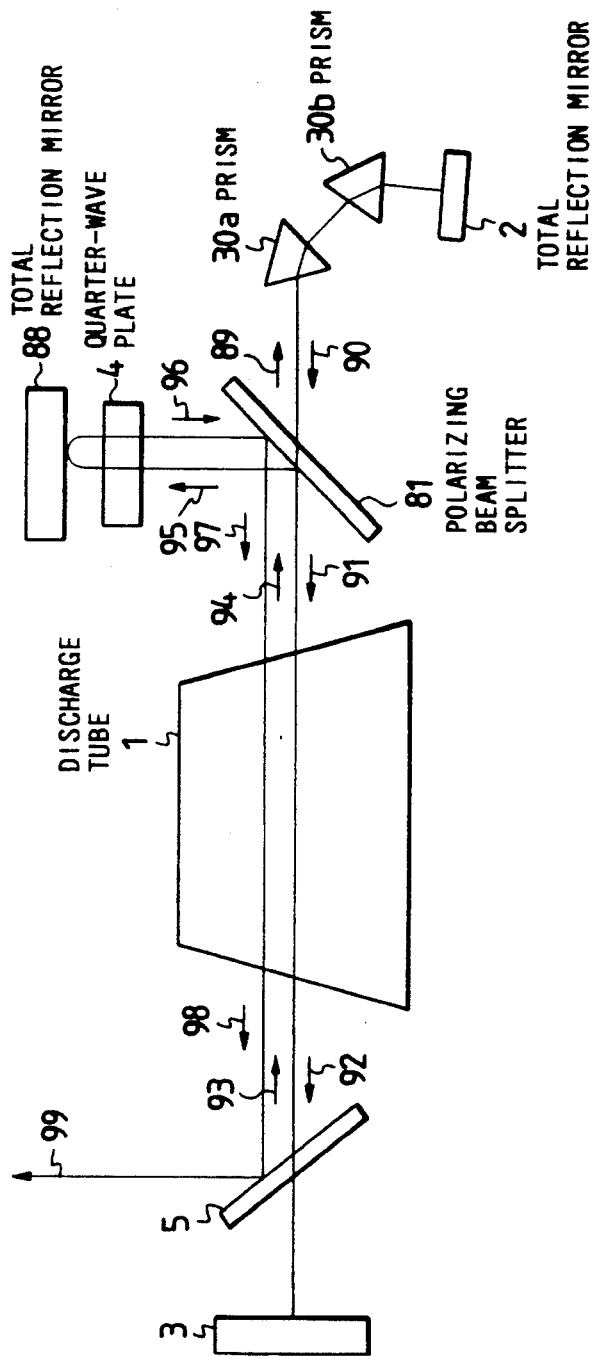
FIG. 21 is a front view of an eleventh embobiment.
Figure 24:
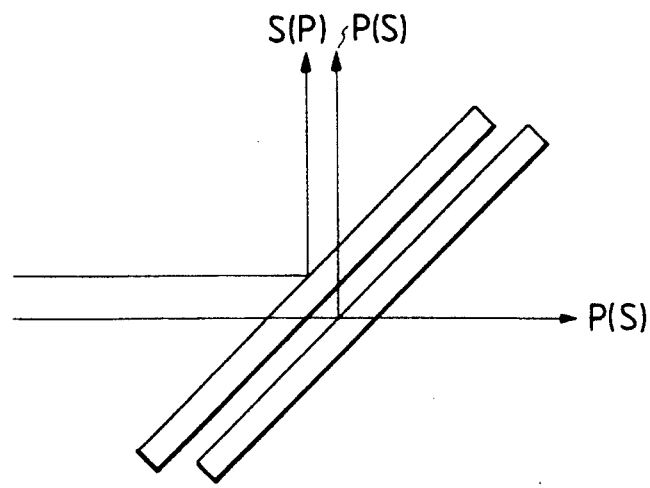
FIG. 24 is a front view of an alternative embodiment of the polarizing beam splitter of the embodiment.

Referring to FIG. 21, an eleventh embodiment of the invention will be described. In FIG. 21 which is a front view of the eleventh embodiment, the structure of this embodiment is the same as that of the ninth embodiment expect that prisms 30a and 30b are provided in replace with Fabry-Perot etalon 6. The prisms 30a and 30b provided between the polarizing beam splitter 5 and the total reflection mirror 2 select a specific wavelength by refraction of light is provided in the light path of the resonator. The resonator light path is formed total reflection mirrors 2 and 3 through the prisms 30a and 30b. Functions of other portions are the same as that of the ninth embodiment. Thus, detailed description is omitted.

As mentioned above, embodiments using a Fabry-Perot etalon, a grating, and prisms as an wavelength selection element are described. When the Fabry-Perot etalon is used, it is considered that the reflection planes thereof where high energy is confined by multi-reflection between confronting reflection planes tends to be deteriorated. This is because this optical element selects wavelength by interference between the two reflection planes confronted. On the other hand, when the grating 20 or prisms 30a and 30b described in second and third embodiments is used, deterioration is reduced because wavelength selection is performed by reflection or refraction, so that the threshold value of these elements is several times as high as that of Fabry-Perot etalon.

Hereinbelow will be described a twelfth embodiment of the invention.

FIGS. 22 and 23 show the twelfth embodiment of the invention of a narrow-band laser apparatus. FIG. 22 is front view of the narrow-band laser apparatus and FIG. 23 is bottom view of a phase retarder prism. In FIGS. 22 and 23, the phase retarder prism 40 functions as the quarter-wave plate 4 and the second total mirror 3 described in the ninth embodiment. Structure of other portions are the same as that of the ninth embodiment.

FIG. 12 is a perspective view of the phase retarder prism 40. In FIG. 12, the phase retarder prism 40 is made of high-transmittance material, such as, synthesized quartz and $CaF_2$. Anti-reflection coat surface (AR coat surface) is formed on a surface 43 where a light beam 29 enters the phase retarder prism 40 and a light beam 26 exits. Further, this surface 43 is inclined by abaout 2° so that the incident light beam 29 directly reflected at this surface 43 is not mixed with the output light beam 26. Thus, this prism 40 has apex angles 45°, 47°, and 88° unlike the normal type 45° prism. A surface 42 reflects the light beam at a right angle. A dielectric multilayer is formed on the surface 42, which produces P and S polarizing components having 90° phase difference therebetween in accordance with structure and thickness of dielectric layers and is optically equivalent to the quarter-wave plate 4. The light beam reflected at the surface 42 is reflected at a total reflection surface 41 at aright angle and outputted (light beam 26) in the opposite direction. The total reflection mirror surface 41 can be formed easily by a dielectric multilayer.

As mentioned above, according to this embodiment, the phase retarder prism 40 functions as the quarter-wave plate 4 and the second total reflection mirror 88 and thus, it makes the structure of the apparatus simple and adjustment easy.

In the above-mentioned embodiment, a phase retarder prism 40 is used but other wavelength selection elements can be used, such as Fabry-Perot etalon 6, prism 30, or grating 20.

The above-mentioned ninth to twelfth embodiments describe laser apparatus where lasing oscillation is performed by P polarizing component, and then P polarizing component is converted into S component which is amplified to output laser beam. In contrast with this, it is possible that lasing oscillation is performed by S polarizing component, and then S polarizing component is converted into P component which is amplified to output laser beam. In such case, ratios of the polarizing beam splitters 4 and 5 are inverted. Therefore, it is possible to select either polarizing components for oscillation or amplifying in order to make easier carrying out above-mentioned embodiments.

As mentioned above, there various types of polarizing conversion element for producing polarizing components, each component having polarizing plane different from each other, such as Fresnel rhomboid prism, thee-time total reflection ultra-achromatic quarter-wave plate, etc. In order to obtain a large-diameter beam for exposure, a first-order or multiple-order quarter-wave plate using a crystal quartz plate is suitable. Moreover, it is not necessary that a quarter-wavelength plate is not accurate. In other words, a phase plate capable of changing the ratio between polarized components S and P can be used.

Further, a multilayer cube polarizing element, a transparent plate of Brewster's angle, a Wollaston prism, etc., can be used as the polarizing beam splitter mentioned above. In order to obtain large diameter beam for exposure, a polarization beam split mirror is excellent.

Figure 25:
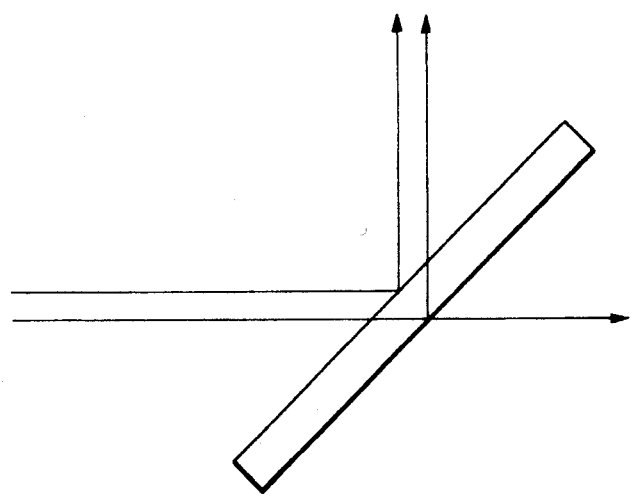
FIG. 25 is a front view of an alternative embodiment of the polarizing beam splitter of the embodiment.

The polarizing beam splitter 4 may be comprise a combination of a perfect polarizing beam splitter 50 with a half mirror 51 for the same function as that of the polarizing beam splitter 4. As shown in FIG. 25 the polarizing beam splitter 81 may also comprise a polarizing beam splitting film 52 made of dielectric layer formed on a plate of quartz or $CaF_2$ whose other surface is covered with semi-transparent film 53.

Further, a multilayer cube polarizing element, a transparent plate of Brewster's angle, a Wollaston prism, etc., can be used as the polarizing beam splitter mentioned above. In order to obtain large diameter beam for exposure, a polarization beam split mirror is excellent.

Moreover, in the above-mentioned embodiments, the wavelength selection element is provided between the polarization beam splitter and the total mirror 2. However, the wavelength selection element can be provided to other position except the light path from the laser medium to the polarization beam splitter where the output laser beam is the most powerful light beam.

Plural Fabry-Perot etalons 6, gratings 20, or prisms 30 used in the above-mentioned embodiments can be used as an wavelength selection element or combination between the above-mentioned elements may be used. Moreover, an element combing of an wavelength selection element with a total reflection mirror, such as echelle grating or echelon grating for utilizing wavelength selection function of gratings. In the prism used in above-mentioned embodiment, a total reflection mirror may be formed on one surface thereof. Further, the number of elements can be reduced by combing function of the quarter-wave plate with that of the total reflection mirror 2, i.e., a total reflection surface is formed on one surface of a plate of $MgF_2$ or quartz phase plate. In other words, the number of elements can be reduced by using an element combining function between these elements for the above-mentioned wavelength selection element, a total reflection mirror, a quarter-wave plate, polarizing beam splitter, etc.

The phase retarder prism 40 used in the above-mentioned embodiment can be replaced with a phase retarder mirror whose reflection surface shows phase retarding function which is similar to the phase retarder prism 40.

It is not necessary that the total reflection mirrors used in the above-mentioned embodiment have 100% reflectance but it may be a reflectance which maintains optical resonating.

As mentioned above, according to this invention, a portion polarized light beam is taken out by polarizing beam splitter from one polarized light beam; the beam taken out is subjected to polarizing direction conversion by a polarizing conversion element and then it is amplified by the laser medium; and then amplified beam is outputted by a polarizing beam splitter. Therefore, light energy transmitted through the wavelength selection element is reduced by an inverse number of the gain of the laser medium, so that deformation or deterioration of the wavelength selection element is reduced. As a result, a narrow-band laser apparatus suitable for an exposure light source for photolithography is provided without variation of section wavelength or decrease in output power.

Figure 28:
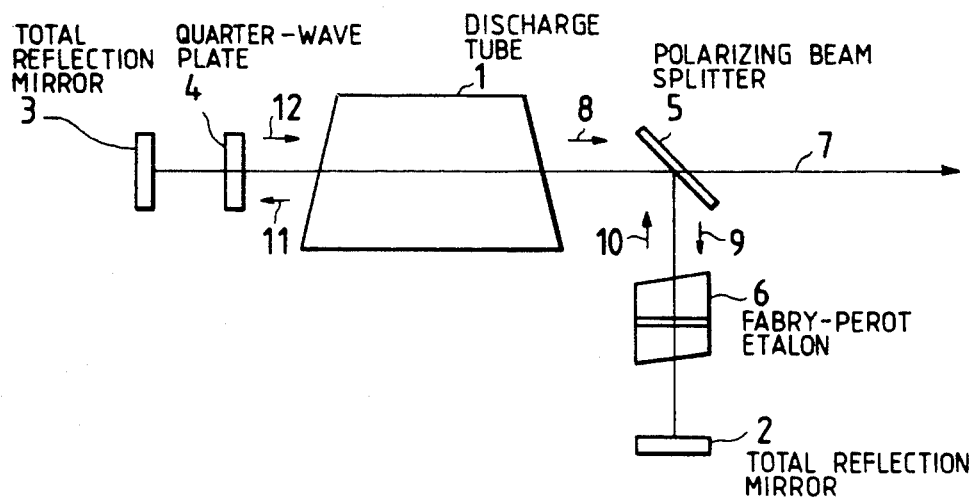
FIG. 28 is a front view of a thirteenth embodiment of a laser apparatus of the invention.

Referring now to the drawings, FIG. 28 is a front view of a thirteenth embodiment of narrow-band excimer laser apparatus of the invention.

In FIG. 28, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirror 2 and 3 via a polarizing beam splitter 5. When the discharge tube 1 is excited a laser beam of ultraviolet is generated there. A quarter-wave plate as a polarizing conversion element for changing ratio of P to S polarizing components and a polarizing beam splitter 5 as a polarizing beam splitting element are provided in the light path of the optical resonator, as shown. An ouputput light beam 8 amplified by the laser medium of the discharge tube 1 is separated into one polarized light beam 7 outputted externally and another polarized light beam 9 by the polarizing beam splitter 5.

A Fabry-Perot etalon 6 as an wavelength selection element is provided between the polarizing beam splitter 5 and total reflection mirror 2, so that only specified narrow-band light beam is oscillated in the optical resonator.

Hereinbelow will be described operation of the laser apparatus of the thirteenth embodiment.

The light beam 8 amplified by the laser medium of the discharge tube 1 is splitted in accordance with polarized components. One polarized component is transmitted through the polarizing beam splitter 5 and outputted as the output light beam 7. Another component light beam, i.e., a light beam 9, is reflected by the polarizing beam splitter 5. The light beam 9 is subjected to wavelength selection by Fabry-Perot etalon 6, and then it is reflected at the total reflection mirror 2. The reflected light beam 10 is transmitted through the Fabry-Perot etalon 6 reflected by the polarizing beam splitter 5 again and is amplified by the laser medium. The amplified light beam 11 enters the quarter-wave plate 4. The light beam 11 is transmitted through the quarter-wave plate 4 twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. Generally, it is possible to set a ratio between both polarization components of the reflected light beam 12 by changing rotational position of the quarter-wave plate 4 around the center of the axis of the light path. The reflected light 12 is amplified by the laser medium of the discharge tube 1 to produce the light beam 8. One polarization component of the light beam 8 is transmitted through the polarizing beam splitter 5 as the output light beam 7. Another component is reflected at the polarizing beam splitter 5 as the light beam 9 which maintains oscillation. Here, lasing coupling ratio of the output light beam can be changed by varying ratio between intensities of the output light beam 7 and reflected light beam 9 by rotation of the quarter-wave plate 4. As mentioned above, an intensity of the output light beam 7 is larger than that of the light beam 9 to the extent of a gain of the laser medium so that deformation and deterioration of the Fabry-Perot etalon 6 is considerably reduced.

Figure 47:
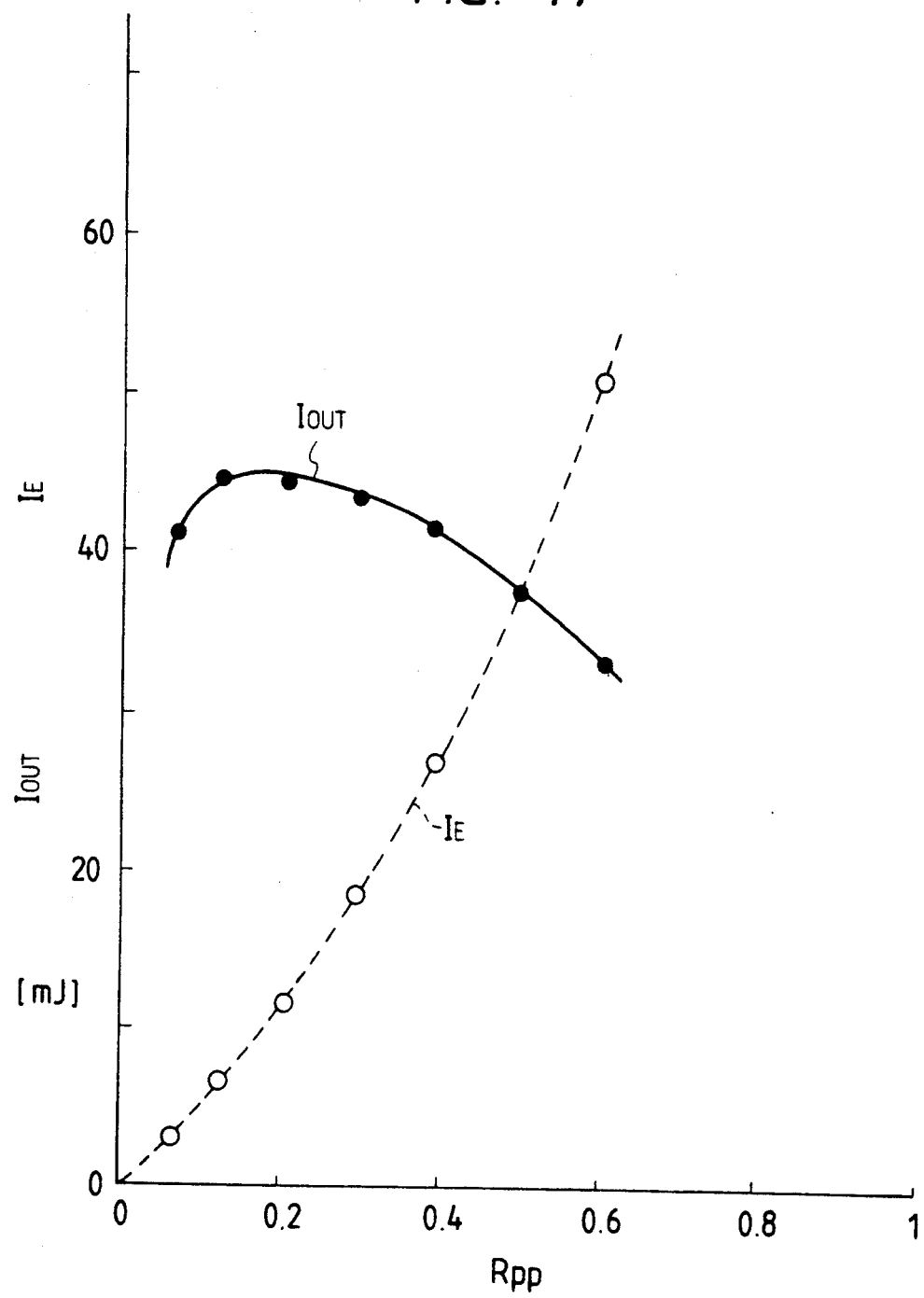
FIG. 47 is an explanatory chart of the thirteenth embodiment.

FIG. 47 shows an experimental result showing a relationship between output laser light intensity Iout and light intensity $I_E$ at the Fabry-perot etalon 6 of the thirteenth embodiment with respect to ratio of the light beam 9 to the light beam 8, i.e., coupling factor for laser oscillation. The result is obtained using KrF excimer laser of FIG. 28. The mixed gas of laser medium comprises 0.22% of $F_2$, 4.4% of Kr, and remains of He. Full pressure is 1800 mb. Laser oscillation is performed by application of a supply voltage of 28 KV to the discharge tube 1. The resultant shows Iout and Fabry-Perot etalon load $I_E$ per one pulse under this condition. FIG. 8 shows another experimental result under the same condition, which shows the same relation with respect to reflectance R of half mirror 103 of the prior art of FIG. 7. In FIG. 47, the maximum output laser light intensity Iout is about 44 mJ and at the same time, Fabry-Perot etalon $I_E$ is about 10 mJ. On the other hand, in FIG. 8 of prior art, the maximum output laser light intensity Iout is about 14 mJ and at the same time, etalon load $I_E$ is about 23 mJ. Therefore, output light intensity Iout of the thirteenth embodiemnt is about three times that of the prior art of FIG. 7, on the other hand, Fabry-Perot etalon load $I_E$ is about 58% of the prior art.

Figure 29:
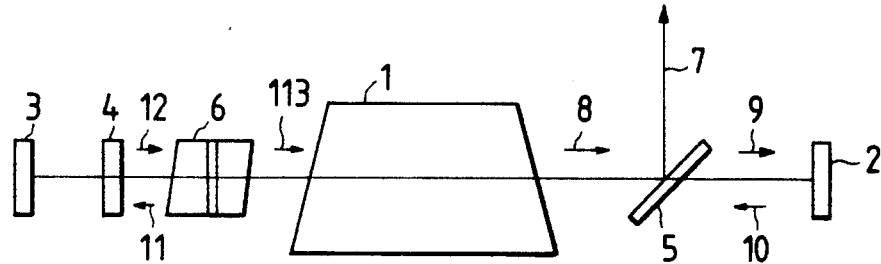
FIG. 29 is a front view of a fourteenth embodiment.

Hereinbelow will be described a fourteenth embodiment. FIG. 29 is a front view of the fourteenth embodiment of a laser apparatus of the invention. In FIG. 29, an optical resonator comprises total reflection mirrors 2 and 3. A discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is separated into one polarized light beam 7 outputted externally and another polarized light beam 9 by the polarizing beam splitter 5.

A Fabry-Perot etalon 6 as an wavelength selection element is provided between the discharge tube 1 and the quarter-wave plate 4, so that only specified narrowband light beam is oscilliated in the optical resonator. This embodiment readily provides S polarized component light because the polarizing beam splitter for reflecting S polarizing component can be provided readily.

Hereinbelow will be described operation of the laser apparatus of the fourteenth embodiment.

The light beam 8 amplified by the laser medium of the discharge tube 1 is splitted in accordance with polarized components. One polarized component is outputted as the output light beam 7. Another component light beam, i.e., a light beam 9, is transmitted through the polarizing beam splitter 5. The light beam 9 is reflected at the total reflection mirror 2. The reflected light beam 10 is transmitted through the polarizing beam splitter 5 again and is amplified by the laser medium. The amplified light beam is transmitted through the Fabry-Perot etalon 6 where an wavelength selection is performed. The light beam 11 from the Fabry-Perot etalon 6 is transmitted through the quarter-wave plate 4 twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. Generally, it is possible to set a ratio between both polarization components of the reflected light beam 12 by changing rotational position of the quarter-wave plate 4 around the center of the axis of the light path. The reflected light 12 is transmitted through the Fabry-Perot etalon 6. The light beam 113 from the Fabry-Perot etalon 6 is amplified by the laser medium of the discharge tube 1 to produce the light beam 8. One polarization component of the light beam 8 is reflected at the polarizing beam splitter 5 as the output light beam 7. Another component is transmitted through the polarizing beam splitter 5 as the light beam 9 which maintains oscillation. As mentioned above, an intensity of the output light beam is larger than that of the light beam 113 to the extent of a gain of the laser medium so that deformation and deterioration of the Fabry-Perot etalon 6 is reduced. The light load of the Fabry-Perot etalon 6 used in the fourteenth embodiment is slightly larger than that of the thirteenth embodiment. This embodiment readily provides P polarizing component.

Figure 30:
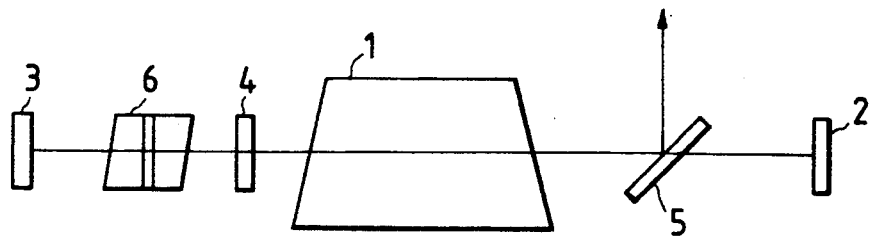
FIG. 30 is a front view of a fifteenth embodiment.

Hereinbelow will be described a fifteenth embodiment. FIG. 30 is a front view of the fifteenth embodiment of a laser apparatus of the invention. Basic structure of the fifteenth embodiment is the same as that of the fourteenth embodiment. There is a difference that the Fabry-Perot etalon 6 is provided between the quarter-wave plate 4 and the total reflection mirror 3. Basic operation of the fifteenth embodiment is the same as that of the fourteenth embodiment. Thus, a detailed description is omitted.

Figure 31:
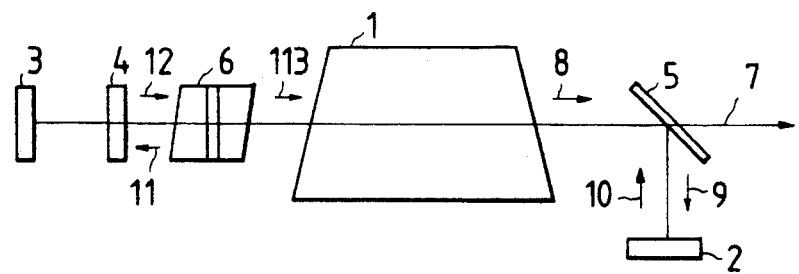
FIG. 31 is a front view of a sixteenth embodiment.

Hereinbelow will be described a sixteenth embodiment. FIG. 31 is a front view of the sixteenth embodiment of a laser apparatus of the invention. FIG. 31, an optical resonator comprises total reflection mirrors 2 and 3. A discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is separated into one polarized light beam 7 outputted externally and another polarized light beam 9 by the polarizing beam splitter 5.

A Fabry-Perot etalon 6 as an wavelength selection element is provided between the discharge tube 1 and the quarter-wave plate 4, so that only specified narrowband light beam is oscillated in the optical resonator.

Hereinbelow will be described operation of the laser apparatus of the sixteenth embodiment.

The light beam 8 amplified by the laser medium of the discharge tube 1 is splitted in accordance with polarized components. One polarized component is outputted as the output light beam 7. Another component light beam, i.e., a light beam 9, is reflected at the polarizing beam splitter 5. The light beam 9 is reflected at the total reflection mirror 2. The reflected light beam 10 is reflected at the polarizing beam splitter 5 again and is amplified by the laser medium. The amplified light beam is transmitted through the Fabry-Perrot etalon 6 where an wavelength selection is performed. The light beam 11 from the Fabry-Perot etalon 6 is transmitted through the quarter-wave plate 4 twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. The reflected light 12 is transmitted through the Fabry-Perot etalon 6. The light beam 113 from the Fabry-Perot etalon 6 is amplified by the laser medium of the discharge tube 1 to produce the light beam 8. One polarization component of the light beam 7 is transmitted through the polarizing beam splitter 5 as the output light beam. Another component is reflected at the polarizing beam splitter 5 as the light beam 9 which maintains oscillation. As mentioned above, an intensity of the output light beam 7 is larger than that of the light beam 113 to the extent of a gain of the laser medium so that deformation and deterioration of the Fabry-Perot etalon 6 is reduced. The light load of the Fabry-Perot etalon 6 used in the sixteenth embodiment is slightly larger than that of the thirteenth embodiment. This embodiment readily provides P polarized light because the polarizing beam splitter for transmitting P polarizing component can be provided readily.

Figure 32:
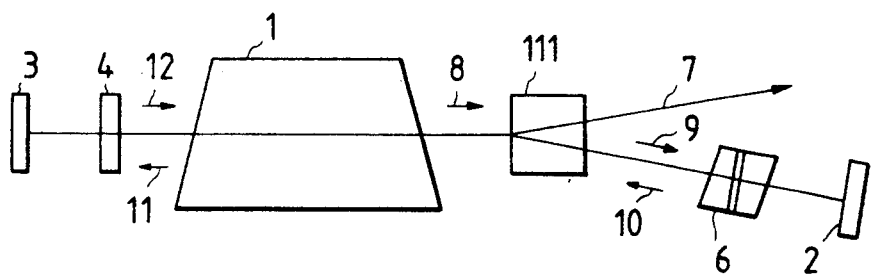
FIG. 32 is a front view of a seventeenth embodiment.

Hereinbelow will be described a seventeenth embodiment. FIG. 32 is a front view of the seventeenth embodiment of a laser apparatus of the invention. In FIG. 32, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirrors 2 and 3. When the discharge tube 1 is excited a laser beam of ultraviolet is generated there. A quarter-wave plate 4 as a polarizing conversion element for changing ratio of P to S polarizing components and an Wollaston prism 111 as a polarizing beam splitting element are provided in the light path of the optical resonator, as shown. An output light beam 8 amplified by the laser medium of the discharge tube 1 is separated into one polarized light beam 7 outputted externally and another polarized light beam 9 by the Wollaston prism 111.

A Fabry-Perot etalon 6 as an wavelength selection element is provided between the Wollaston prism 111 and the total reflection mirror 2, so that only specified narrow-band light beam is oscillated in the optical resonator.

Hereinbelow will be described operation of the laser apparatus of the seventeenth embodiment.

The light beam 8 amplified by the laser medium of the discharge tube 1 is splitted in accordance with polarized components. One component is outputted as the output light beam 7. Another component light beam, i.e., a light beam 9, is transmitted through the Wollaston prism 111. The light beam 9 is subjected to wavelength selection by Fabry-Perot etalon 6, and then it is reflected at the total reflection mirror 2. The reflected light beam 10 is transmitted through the Fabry-Perot etalon 6 and the Wollaston prism 111 again and is amplified by the laser medium. The amplified light beam 11 enters the quarter-wave plate 4. The light beam 11 is transmitted through the quarter-wave plate twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. The reflected light 12 is amplified by the laser medium of the discharge tube 1 to produce the light beam 8. One polarization component of the light beam 8 is transmitted through the Wollastom prism 111 as the output light beam 7. Another component is transmitted through the Wollaston prism 111 as the light beam 9 which maintains oscillation. As mentioned above, an intensity of the output light beam 7 is larger than that of the light beam 9 to the extent of a gain of the laser medium so that deformation and deterioration of the Fabry-Perot etalon 6 is considerably reduced.

Figure 33:
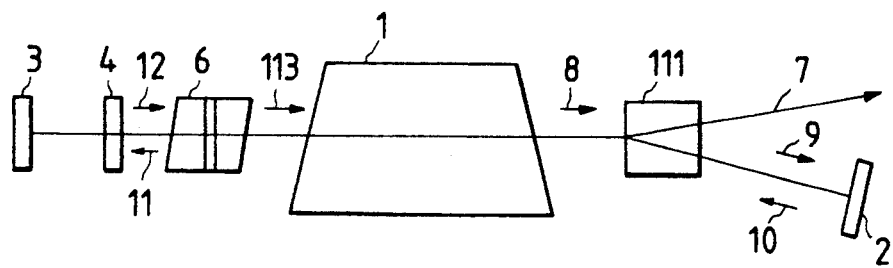
FIG. 33 is a front view of a eighteenth embodiment.

Hereinbelow will be described a eighteenth embodiment. FIG. 33 is a front view of the eighteenth embodiment of a laser apparatus of the invention. In FIG. 33, an optical resonator comprises total reflection mirrors 2 and 3. A discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and an Wollaston prism 111 as a polarizing beam splitting element are provided in the light path of the optical resonator, as shown. An ouput light beam 8 amplified by the laser medium of the discharge tube 1 is separated into one polarized light beam 7 outputted externally and another polarized light beam 9 by the Wollaston prism 111.

A Fabry-Perot etalon 6 as an wavelength selection element is provided between the discharge tube 1 and the quarter-wave plate 4, so that only specified narrow-band light beam is oscillated in the optical resonator.

Hereinbelow will be described operation of the laser apparatus of the eighteenth embodiment.

The light beam 8 amplified by the laser medium of the discharge tube 1 is splitted in accordance with polarized components. One polarized component is splitted and outputted as the output light beam 7. Another component light beam, i.e., a light beam 9, is splitted and bended by the Wollaston prism 111. The light beam 9 is reflected at the total reflection mirror 2. The reflected light beam 10 is transmitted through the Wollaston prism 111 again which returns the light beam 10 to a light path to the discharge tube 1. The light beam from the Wollaston prism 111 is amplified by the laser medium. The amplified light beam is transmitted through the Fabry-Perot etalon 6 where an wavelength selection is performed. The light beam 11 from the Fabry-Perot etalon 6 is transmitted through the quarter-wave plate 4 twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. The reflected light 12 is transmitted through the Fabry-Perot etalon 6. The light beam 113 from the Fabry-Perot etalon 6 is amplified by the laser medium of the discharge tube 1 to produce the light beam 8. One polarization component of the light beam 8 is bended in one direction by the Wollaston prism 111 is outputted as output light beam 7. Another component is bended in another direction as the light beam 9 which maintains oscillation. As mentioned above, an intensity of the output light beam 7 is larger than that of the light beam 113 to the extent of a gain of the laser medium so that deformation and deterioration of the Fabry-Perot etalon 6 is reduced. The light load of the Fabry-Perot etalon 6 used in the fourteenth embodiment is slightly larger than that of the thirteenth embodiment.

Figure 34:
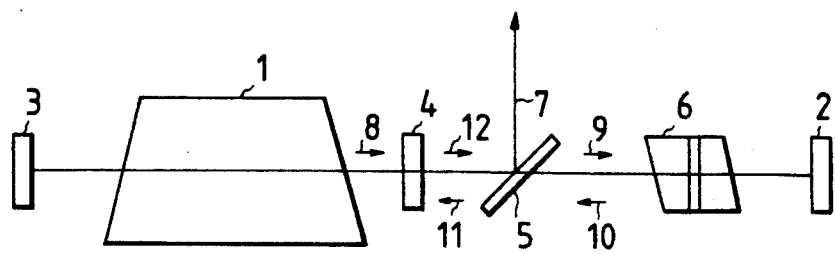
FIG. 34 is a front view of a nineteenth embodiment.

Hereinbelow will be described a nineteenth embodiment. FIG. 34 is a front view of the nineteenth embodiment of a laser apparatus of the invention.

In FIG. 34, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is transmitted through the quarter-wave plate 4 and is separated into one polarized light beam 7 outputted externally and another polarized light beam 9 by the polarizing beam splitter 5.

A Fabry-Perot etalon 6 as an wavelength selection element is provided between the polarizing beam splitter 5 and the total reflection mirror 2, so that only specified narrow-band light beam is oscillated in the optical resonator.

Hereinbelow will be described operation of the laser apparatus of the nineteenth embodiment.

The light beam 8 amplified by the laser medium of the discharge tube 1 is splitted in accordance with polarized components. One polarized component is outputted as the output light beam 7. Another component light beam, i.e., a light beam 9, is transmitted through the polarizing beam splitter 5. The light beam 9 is subjected to wavelength selection by Fabry-Perot etalon 6, and then it is reflected at the total reflection mirror 2. The reflected light beam 10 is transmitted through the Fabry-Perot etalon 6 and the polarizing beam splitter 5 again and is amplified by the laser medium after transmission through quarter-wave plate 4. The light beam 11 is transmitted through the quarter-wave plate 4 twice via the total reflection mirror 3. This twice transmission through the quarter-wave plate 4 is equivalent to one transmission through a half wavelength plate. Thus, the light beam 11 polarized in one direction is converted into the reflection light beam 12 having both polarization components. The reflected light at the total reflection mirror is amplified by the laser medium of the discharge tube 1 to produce the light beam 8. One polarization component of the light beam 12 is reflected at the polarizing beam splitter 5 as the output light beam 7. Another component is transmitted through the polarizing beam splitter 5 as the light beam 9 which maintains oscillation. As mentioned above, an intensity of the output light beam 7 is larger than that of the light beam 9 to the extent of a gain of the laser medium so that deformation and deterioration of the Fabry-Perot etalon 6 is considerably reduced. Light load of the quarter-wave plate 4 is larger than that would be in the case that the quarter-wave plate 4 is locate between the discharge tube 1 and the total reflection mirror 3. However, output efficiency is equivalent.

Figure 35:
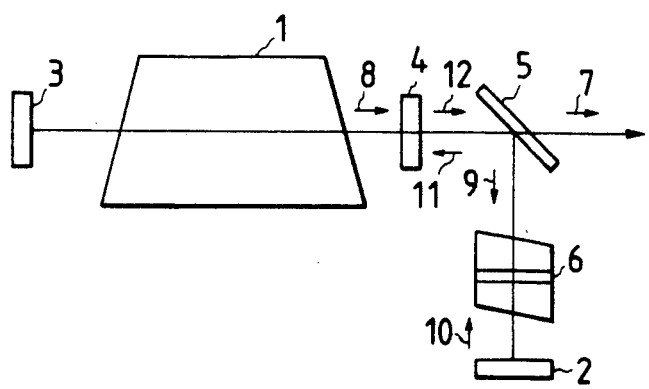
FIG. 35 is a front view of a twentieth embodiment.

Hereinbelow will be described a twentieth embodiment. FIG. 35 is a front view of the twentieth embodiment of a laser apparatus of the invention.

In FIG. 35, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirror 2 and 3 via a polarizing beam splitter 5. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is separated into one polarized light beam 7 outputted externally and another polarized light beam 9 by the polarizing beam splitter 5 after transmission through the quarter-wave plate.

A Fabry-Perot etalon 6 as an wavelength selection element is provided between the polarizing beam splitter 5 and the total reflection mirror 2, so that only specified narrow-band light beam is oscillated in the optical resonator.

Hereinbelow will be described operation of the laser apparatus of the twentieth embodiment.

The light beam 8 amplified by the laser medium of the discharge tube 1 is splitted in accordance with polarized components after transmission through the quarter-wave plate 4. One polarized component is transmitted through the polarizing beam splitter 5 and outputted as the output light beam 7. Another component light beam, i.e., a light beam 9, is reflected by the polarizing beam splitter 5. The light beam 9 is subjected to wavelength selection by Fabry-Perot etalon 6, and then it is reflected at the total reflection mirror 2. The reflected light beam 10 is transmitted through the Fabry-Perot etalon 6 and reflected by the polarizing beam splitter 5 again and is amplified by the laser medium after transmission through the quarter-wave plate 4. The light beam 11 is transmitted through the quarter-wave plate 4 twice via the total reflection mirror 3. This twice transmission through the quarter-wave plate 4 is equivalent to one transmission through a half wavelength plate. Thus, the light beam 11 polarized in one direction is converted into the light beam 12 having both polarization components. The light beam 12 is amplified by the laser medium of the discharge tube 1. One polarization component of the light beam 12 is transmitted through the polarizing beam splitter 5 as the output light beam 7. Another component is reflected at the polarizing beam splitter 5 as the light beam 9 which maintains oscillation. As mentioned above, an intensity of the output light beam 7 is larger than that of the light beam 9 to the extent of a gain of the laser medium so that deformation and deterioration of the Fabry-Perot etalon 6 is considerably reduced. Light load of the quarter-wave plate 4 is larger than that would be in the case that the quarter-wave plate 4 is locate between the discharge tube 1 and the total reflection mirror 3. However, ouput efficiency is equivalent. This embodiment readily provides P polarized component light.

Figure 36:
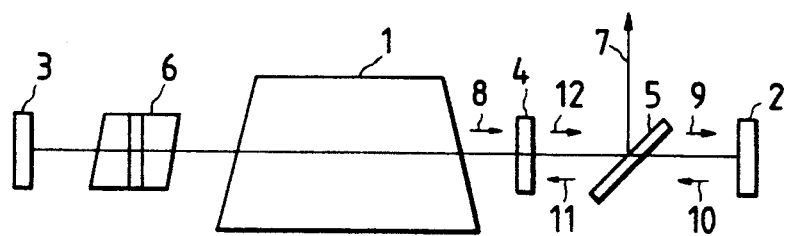
FIG. 36 is a front view of a twenty-first embodiment.

Hereinbelow will be described a twenty-first embodiment. FIG. 36 is a front view of the twenty-first embodiment of a laser apparatus of the invention.

In FIG. 36, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is transmitted through the quarter-wave plate 4. A light beam from the quarter-wave plate 4 is separated into one polarized light beam 7 outputted externally and another polarized light beam 9 by the polarizing beam splitter 5.

A Fabry-Perot etalon 6 as an wavelength selection element is provided between the discharge tube 1 and the total reflection mirror 3, so that only specified narrow-band light beam is oscillated in the optical resonator.

Hereinbelow will be described operation of the laser apparatus of the twenty-first embodiment.

The light beam 8 amplified by the laser medium of the discharge tube 1 is splitted in accordance with polarized components after transmission through the quarter-wave plate 4. One polarized component is outputted as the output light beam 7. Another component light beam, i.e., a light beam 9, is transmitted through the polarizing beam splitter 5. The light beam 9 is reflected at the total reflection mirror 2. The reflected light beam 10 is transmitted through the polarizing beam splitter 5 again and is amplified by the laser medium after transmission through the quarter-wave plate 4. The light beam 11 is transmitted through the quarter-wave plate 4 twice via the total reflection mirror 3. This twice transmission through the quarter-wave plate 4 is equivalent to one transmission through a half wavelength plate. Thus, the light beam 11 polarized in one direction is converted into the reflection light beam 12 having both polarization components. The light beam from the quarter-wave plate 4 is amplified by the laser medium and then transmitted through the Fabry-Perot etalon 6. The amplified light beam and reflected light at the total reflection mirror 3 is subjected to wavelength selection by the Fabry-Perot etalon 6. A light beam after wavelength selection is amplified by the laser medium of the discharge tube 1 to produce the light beam 8. One polarization component of the light beam 12 is reflected at the polarizing beam splitter 5 as the output light beam 7. Another component is transmitted through the polarizing beam splitter 5 as the light beam 9 which maintains oscillation. As mentioned above, an intensity of the output light beam 7 is larger than that of the light beam 9 to the extent of a gain of the laser medium so that deformation and deterioration of the Fabry-Perot etalon 6 is considerably reduced. The light load of the Fabry-Perot etalon 6 used in the twenty-first embodiment is slightly larger than that of the thirteenth embodiment.

Hereinbelow will be described a twenty-second embodiment of the invention with referring to FIG. 37.

FIG. 37 is a front view of twenty-second embodiment of a narrow-band laser apparatus. In FIG. 37, an optical resonator comprises total reflection mirrors 2 and 3 and a discharge tube 1 is provided in the light path of the optical resonator between the total reflection mirrors 2 and 3 which includes a mixed gas of noble and halogen gases as a laser medium. When the discharge tube 1 is excited, a laser beam of ultraviolet is generated there. In a light path of the resonator a polarizing beam splitter 81 is provided between the discharge tube 1 and the first total reflection mirror 2. A polarizing beam splitter 5 is provided between the discharge tube 1 and the second total reflection mirror 3. The polarizing beam splitter 81 separates propagation directions of light beams having different polarizing components. However, a portion of one polarizing component is reflected at the polarizing beam splitter 81 and other portion is transmitted through the polarizing beam splitter 81. For example, the polarizing beam splitter 81 reflects 100% of S polarizing component but transmits a ratio T of P polarizing component and reflects a ratio $(1-T)$ of P polarizing component. The ratio T ranges from 0.005 to 0.8 approximately. The polarizing beam splitter 5 separates propagation direction of light beams of different polarizing directions. For example, it transmits 100% of S polarizing light and reflects 100% of P polarizing light. Therefore, S polarizing light 99 is outputted. A Fabry-Perot etalon 6 is provided between the polarizing beam splitter 81 and the first total reflection mirror 2 as an wavelength selection element. A quarter-wave plate 4 and a third total reflection mirror are provided in the light path separated at the polarizing beam splitter 81, i.e., the light path other than the light path of the resonator for maintaining oscillation.

Hereinbelow will be described operation of the aboved-mentioned embodiment.

The polarizing beam splitter 81 transmits amplified P polarizing beam 94 incident thereto partially. The transmitted P polarizing light beam 89 enters the Fabry-Perot etalon 6 as an wavelength selection element, which selects only a given wavelength component from the light beam 89. Then the light beam transmitted through the Fabry-Perot etalon 6 is reflected at the first total mirror 2. The polarizing beam splitter 81 transmits a portion of the light beam 90 (a light beam 91) because the light beam 90 is a P polarizing beam. The discharge tube 1 amplifies the light beam 91 to output a light beam 92. The polarizing beam splitter 5 reflects the light beam 92 because the light beam 12 is P polarized. The transmitted light beam is reflected at the second total reflection mirror 3 and then is reflected at the polarizing beam splitter 5 again as a light beam 93. The light beam 93 is amplified by the discharge tube 1 to output a light beam 94. A portion of the light beam 94 transmits the polarizing beam splitter 81 as a light beam 89 which maintains oscillation in the similar manner mentioned earlier. Other portion of the light beam 94 is reflected at the polarizing beam splitter 81 as a light beam 95. The light beam 95 is transmitted through the quarter-wave plate 4. The transmitted light beam is reflected at the third total mirror 88 and transmits the quarter-wave plate 4 again where P polarizing beam is converted into S polarizing beam, i.e., a light beam 96. This twice transmitting through the quareter-wave plate 4 is equivalent to one transmitting though a half-wave plate. It is known that if an optical axis of the quarter-wave plate 4 is set such that its optical angle has an inclination angle of 45° with respect to polarizing plane of the incident light, the P polarizing incident light is converted into S polarizing light totally. The polarizing beam splitter 81 reflects 100% of S polarizing light beam 96 to produce S polarizing light beam 97 which is amplified by the discharge tube 1. The amplified S polarizing light beam 98 is transmitted through the polarizing beam splitter 5 entirely to output S polarizing output light beam 99.

As mentioned above, deformation and deterioration of the Fabry-Perot etalon 6 decreases considerably because an intensity of the output light beam 99 is larger than that of the light beam 89 incident to the Fabry-Perot etalon 6 by the gain of the laser medium, i.e., the output light beam is taken out after amplifying by the discharge tube 1. Deformation and deterioration of the Fabry-Perot etalon 6 in this embodiment decrease further compared with the thirteenth embodiment because the light beam 90 whose wavelength is selected is amplified by the discharge tube 1 three times, on the other hand, the light beam 10 in FIG. 28 whose wavelength is selected is amplified twice.

Figure 48:
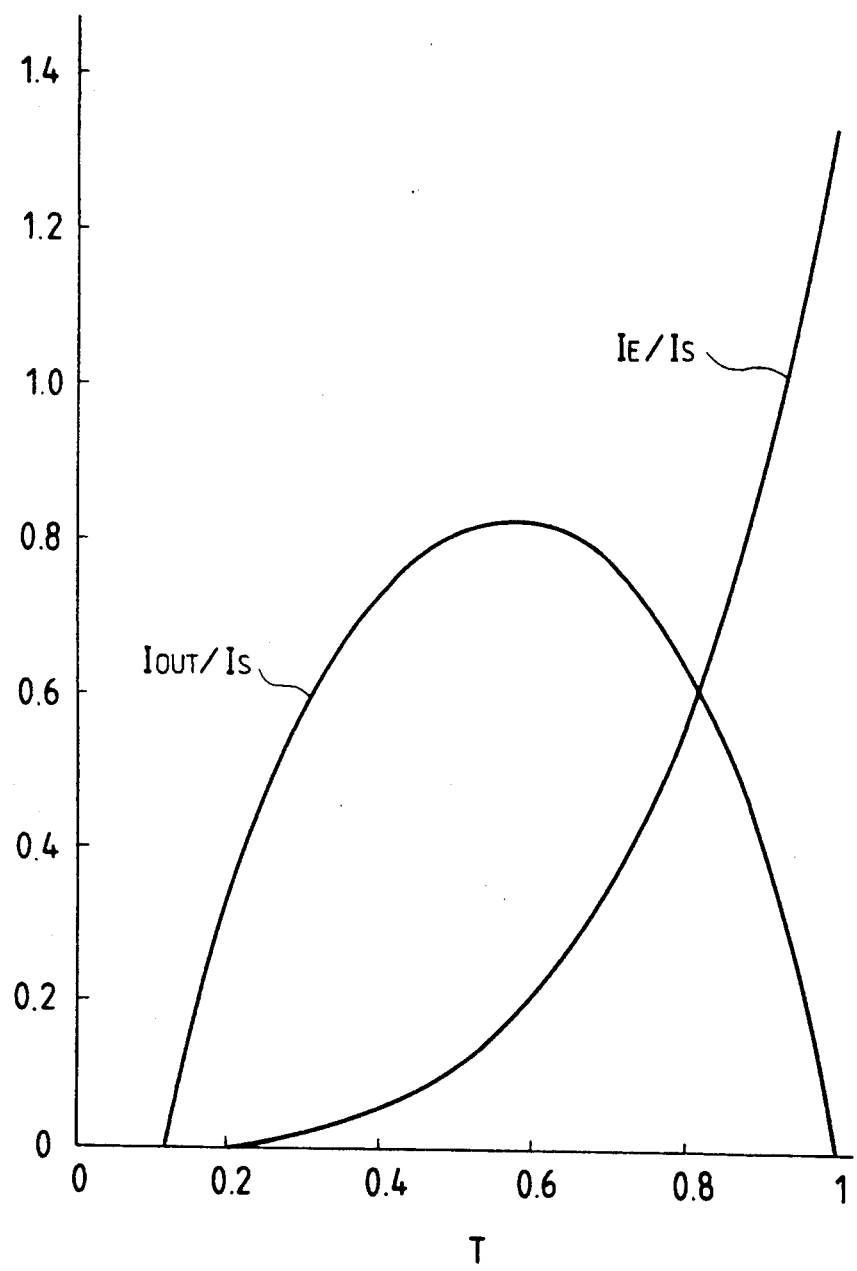
FIG. 48 is an explanatory chart of the twenty-second embodiment.

FIG. 48 shows calculation results showing relationships between light intensity of output light beam 99 and light intensity of the beam 89 as light load of the Fabry-Perot etalon 6 with respect to transmittance of P component in the polarizing beam splitter 81. This result is obtained by modified equations described at "Saturation Effects in High-Gain Lasers" by W. W. RIGROD, Journal of Applied Physics, Vol. 36, No8, P2487-p2490, August 1965(Eqs. 7 and 11 of the document). The results show output light intensity Iout/Is and etalon load light intensity $I_E$/Is which are normalized by saturation light intensity Is with respect to transmittance of P polarizing beam of polarizing beam splitter 8.

FIG. 27 shows calculation results showing relationship between light intensity of output light beam and light intensity of the beam 108 as light load of the Fabry-Perot etalon 104 of the prior art of FIG. 7. This result is obtained by the equations of the aboved-mentioned document. The results show output light intensity Iout/Is and etalon load light intensity $I_E$/Is which are normalized by saturation light intensity Is with respect to reflectance R of the half mirror 103.

Comparing the result shown in FIG. 48 of the embodiment of the invention with the result shown in FIG. 27 of the prior art, it is clear that the embodiment of the invention can output the same Iout with smaller value $I_E$ than that of the prior art FIG. 7. In other words, in Fig. 48, when Iout/Is=0.3, $I_E$/Is=0.004, on the other hand, in FIG. 27, $I_E$/Is=0.41 where the later is more than hundred times the former. Therefore, light intensity of incident light to the Fabry-Perot etalon 6 reduced considerably. Moreover, there is a remarkable feature as follows:

In FIG. 27 of the prior art, when a value of R is 0.15, the maximum output value Iout/Is=0.31 is obtained. On the other hand, in the embodiment of the present invention, when T=0.58, the maximum output Iout/Is=0.83 is obtained. Thus, the output power of the invention is 2.7 times that of the prior art. That indicates the laser apparatus of the invention is excellent as a laser apparatus.

As mentioned above, in this embodiment, light energy transmitted through the Fabry-Perot etalon 6 is largely reduced and a narrow-band laser apparatus showing an excellent characteristics of output efficiency.

Hereinbelow will be described a twenty-third embodiment of the invention with referring to FIG. 38.

FIG. 38 is a front view of the twenty-third embodiment of a narrow-band laser apparatus. In FIG. 38, an optical resonator comprises total reflection mirrors 2 and 3 and a discharge tube 1 is provided in the light path of the optical resonator between the total reflection mirrors 2 and 3 which includes a mixed gas of noble and halogen gases as a laser medium. When the discharge tube 1 is excited, a laser beam of ultraviolet is generated there. In a light path of the resonator a polarizing beam splitter 81′ is provided between the discharge tube 1 and the first total reflection mirror 2. A polarizing beam splitter 5 is provided between the discharge tube 1 and the second total reflection mirror 3. The polarizing beam splitter 81′ separates propagation directions of light beams having different polarizing components at different ratio. For example, the it reflects 30% and transmit 70% of P component and totally transmit S component. However, these ratios can be changed. The polarizing beam splitter 5 separates propagation direction of light beams of different polarizing directions. For example it reflects S component and transmit P component. A quarter-wave plate 4 and a third total reflection mirror are provided in the light path separated at the polarizing beam splitter 81′, i.e., the light path other than the light path of the resonator for maintaining oscillation. A fabry-Perot etalon 6 is provided between the polarizing beam splitter 81′ and the total reflection mirror 2 in the light path of the resonator.

Hereinbelow will be described operation of the above-mentioned embodiment.

The polarizing beam splitter 81′ transmits amplified P polarizing beam 94 incident thereto partially. The transmitted P polarizing light beam 89 enters the quarter-wave plate 4 where P polarizing component is converted into S polarizing component by twice passing therethrough via the third total mirror 88. The polarizing beam splitter 81′ transmits a portion of the light beam 90 (a light beam 91) because the light beam 90 is a S polarizing beam. Some portion of S component is reflected at the polarizing beam splitter 81′. The discharge tube 1 amplifies the light beam 91 to output a light beam 92. The polarizing beam splitter 5 reflects the light beam 92 because the light beam 92 is S polarized. On the other hand, P component partially reflected by the polarizing beam splitter 81′ is transmitted through a Fabry-Perot etalon 6 and reflected back by the total reflection mirror 2. A light beam whose wave-length is selected by the Fabry-Perot etalon 6 is reflected by the polarizing beam splitter 81′ again and amplified by the discharge tube 1. This P component is transmitted through the polarizing beam splitter 5 and is reflected at the second total reflection mirror 3, this component is used for maintaining oscillation.

Hereinbelow will be described a twenty-fourth embodiment of the invention with referring to FIG. 39.

FIG. 39 is a front view of twenty-fourth embodiment of a narrow-band laser apparatus. FIG. 39, an optical resonator comprises total reflection mirrors 2 and 3 and a discharge tube 1 is provided in the light path of the optical resonator between the total reflection mirrors 2 and 3 which includes a mixed gas of noble and halogen gases as a laser medium. When the discharge tube 1 is excited, a laser beam of ultraviolet is generated there. In a light path of the resonator a polarizing beam splitter 81 is provided between the discharge tube 1 and the first total reflection mirror 2. An wollaston prism 111 as a polarizing beam splitting element is provided between the discharge tube 1 and the second total reflection mirror 3. The polarizing beam splitter 81 separates propagation directions of light beams having different polarizing components. However, a portion of one polarizing component is reflected at the polarizing beam splitter 81 and other portion is transmitted through the polarizing beam splitter. The wollaston prism separates propagation direction of light beams of different polarizing directions by bending the light paths of P and S components in different directions, as shown. A Fabry-Perot etalon 6 is provided between the polarizing beam splitter 81 and the first total reflection mirror 2 as an wavelength selection element. A quarter-wave plate 4 and a third total reflection mirror are provided in the light path separated at the polarizing beam splitter 81, i.e., the light path other than the light path of the resonator for maintaining oscillation.

Hereinbelow will be described operation of the above-mentioned embodiment.

The polarizing beam splitter 81 transmits amplified P polarizing beam 14 incident thereto partially. The transmitted P polarizing light beam 89 enters the Fabry-Perot etalon 6 as an wavelength selection element, which selects only a given wavelength component from the light beam 89. Then the light beam transmitted through the Fabry-Perot etalon 6 is reflected at the first total mirror 2. The polarizing beam splitter 81 transmits a portion of the light beam 90 (a light beam 91) because the light beam 90 is a P polarizing beam. The discharge tube 1 amplifies the light beam 91 to output a light beam 92. The wollaston prism 111 transmits and bends the light beam 92 in one direction because the light beam 92 is P polarized. The transmitted light beam is reflected at the second total reflection mirror 3 and then is transmitted through the Wollaston prism 111 again as a light beam 93 to return the light beam 93 to the discharge tube 1. The light beam 93 is amplified by the discharge tube 1 to produce a light beam 94. A portion of the light beam 94 transmits the polarizing beam splitter 81 as a light beam 89 which maintains oscillation in the similar manner mentioned earlier. Other portion of the light beam 94 is reflected at the polarizing beam splitter 81 as a light beam 95. The light beam 95 is transmitted through the quarter-wave plate 4. The transmitted light beam is reflected at the third total mirror 88 and transmits the quarter-wave plate 4 again where P polarizing beam is converted into S polarizing beam, i.e., a light beam 96. This twice transmitting through the quarter-wave plate 4 is equivalent to one transmitting though a half-wave plate. It is known that if an optical axis of the quarter-wave plate 4 is set such that its optical angle has an inclination angle of 45° with respect to polarizing plane of the incident light, the P polarized incident light is converted into S polarizing light totally. The polarizing beam splitter 81 reflects 100% of S polarizing light beam 96 to produce S polarizing light beam 97 which is amplified by the discharge tube 1. The amplified S polarizing light beam 98 is transmitted through the Wollaston prism 111 to output S polarizing output light beam 99.

As mentioned above, deformation and deterioration of the Fabry-Perot etalon 6 decreases considerably because an intensity of the output light beam 99 is larger than that of the light beam 89 incident to the Fabry-Perot etalon 6 by the gain of the laser medium, i.e., the output light beam is taken out after amplifying by the discharge tube 1. Deformation and deterioration of the Fabry-Perot etalon 6 in this embodiment decrease further compared with the thirteenth embodiment because the light beam 90 whose wavelength is selected is amplified by the discharge tube 1 three times, on the other hand, the light beam 10 in FIG. 28 whose wavelength is selected is amplified twice.

The above-mentioned embodiments are described using Fabry-Perot etalon 6, quarter-wave plate 4, polarizing beam splitters 5, 81 and Wollaston prism 111. However, other elements can be applied to this invention. Hereinbelow will be described other embodiments using such elements.

Figure 40A:
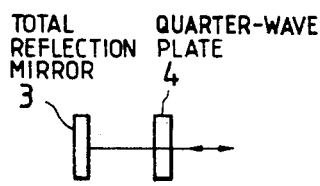
FIGS. 40A to 40C show a first group of equivalent element throughout embodiments.
Figure 40B:
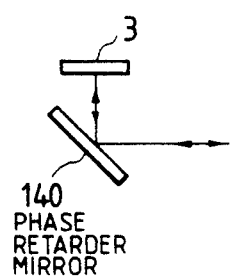
Figure 40C:
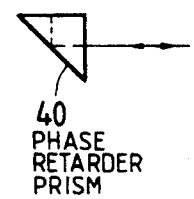

FIG. 40A shows an arrangement of the quarter-wave plate 4 and the total reflection mirror 3. FIGS. 40B and 40C show equivalent arrangements using equivalent elements to these elements. Combination of a phase retarder mirror 140 with the total reflection mirror 3 acts as the that of the quarter-wave plate 4 with the total reflection mirror 3. One type of phase retarder prism 40 is equivalent to those combination. Therefore, these combination and the element can be replaced with each other.

FIG. 12 is a perspective view of the phase retarder prism 40. In FIG. 12, the phase retarder prism 40 is made of high-transmittance material, such as, synthesized quartz and $CaF_2$. Anti-reflection coat surface (AR coat surface) is formed on a surface 43 where a light beam 29 enters the phase retarder prism 40 and a light beam 26 exits. Further, this surface 43 is inclined by about 2° so that the incident light beam 29 directly reflected at this surface 43 is not mixed with the output light beam 26. Thus, this prism 40 has apex angles 45°, 47°, and 88° unlike the normal type 45° prism. A surface 42 reflects the light beam at a right angle. A dielectric multilayer is formed on the surface 42, which produces P and S polarizing components having 90° phase difference therebetween in accordance with structure and thickness of dielectric layers and is optically equivalent to the quarter-wave plate 4. The light beam reflected at the surface 42 is reflected at a total reflection surface 41 at aright angle and outputted (light beam 26) in the opposite direction. The total reflection mirror surface 41 can be formed easily by a dielectric multilayer.

As mentioned above, the phase retarder prism 40 fuctions as the quarter-wave plate 4 and the second total reflection mirror 88 and thus, it makes the structure of the apparatus simple and adjustment easy.

Figure 41A:
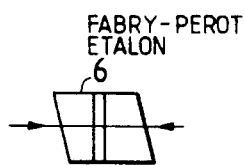
FIGS. 41A to 41C show a second group of equivalent element throughout embodiments.
Figure 41B:
Figure 41C:
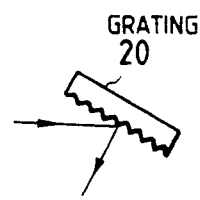

FIG. 41A shows the Fabry-Perot etalon 6. FIGS. 41B and 41C show equivalent elements to these elements. A prism 30 can select a given wavelength component from incident light thereto. A grating 20 also can select a given wavelength component from incident light thereto. Therefore, these elements can be replaced with each other.

Figure 42A:
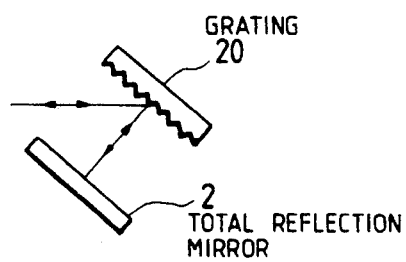
FIGS. 42A and 42B show a third group of equivalent element throughout embodiments.
Figure 42B:

FIG. 42A shows an arrangement of the grating 20 and thpe total reflection mirror 2. FIG. 42B shows an element equivalent to that arrangement. The Littrow type grating or echelle grating 60 can separate a given wavelength component and reflect in the direction opposite to incident light thereto. Therefore, these combination and the element can be replaced with each other.

Figure 43A:
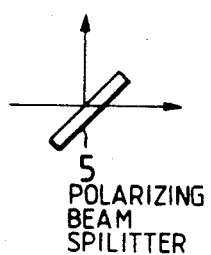
FIGS. 43A to 43C show a fourth group of equivalent element throughout embodiments.
Figure 43B:
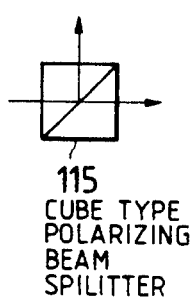
Figure 43C:
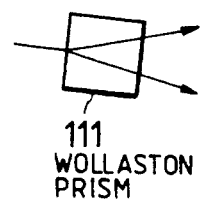

FIG. 43A shows the polarizing beam splitter 5. FIGS. 43B and 43C show elements equivalent to the polarizing beam splitter 5. A cube type polarizing beam splitter can separate incident light into two polarizing components. The Wollaston prism 111 also can separate incident light into two polarizing components. Therefore, these elements can be replaced with each other.

Figure 44A:
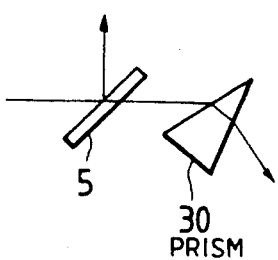
FIGS. 44A and 44B show a fifth group of equivalent element throughout embodiments.
Figure 44B:
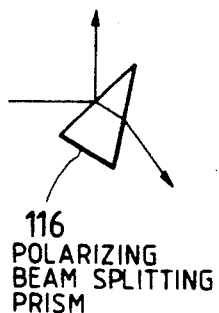

FIG. 44A shows an arrangement of the polarizing beam splitter 5 and the prism 30. FIG. 44B shows an element equivalent to that arrangement. A polarizing beam splitting prism 116 can separate two polarizing components and can separate a given wavelength component from light transmitted there through. The reflective surface thereof comprises dielectric multilayer. Therefore, these combination and the element can be replaced with each other.

In the above-mentioned embodiments of laser apparatus, lasing oscillation is performed with P polarizing component, and then P polarizing component is converted into S component which is amplified to output laser beam. In contrast with this, it is possible that lasing oscillation is performed by S polarizing component, and then S polarizing component is converted into P component which is amplified to output laser beam. Therefore, it is possible to select either polarizing components for oscillation or amplifying in order to make easier carrying out above-mentioned embodiments.

As mentioned above, there are various types of polarizing conversion element for producing polarizing components such as Fresnel rhomboid prism, thee-time total reflection ultra-archromatic quarter-wave plate, etc. In order to obtain a large-diameter beam for exposure, a first-order or multiple-order quarter-wave plate using a crystal quartz plate is suitable. Moreover, it is not necessary that a quarter-wavelength plate is not accurate. In other words, a phase plate capable of changing the ratio between polarized components S and P can be used.

Further, a multilayer cube polarizing element, a transparent plate of Brewster's angle, a Wollaston prism, etc., can be used as the polarizing beam splitter mentioned above. In order to obtain large diameter beam for exposure, a polarization beam split mirror is excellent.

Figure 45:
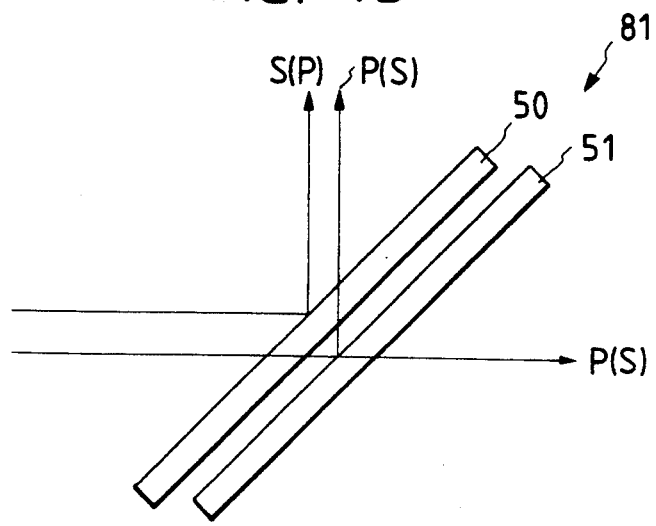
FIG. 45 is a front view of an alternative element of the polarizing beam splitter.
Figure 46:
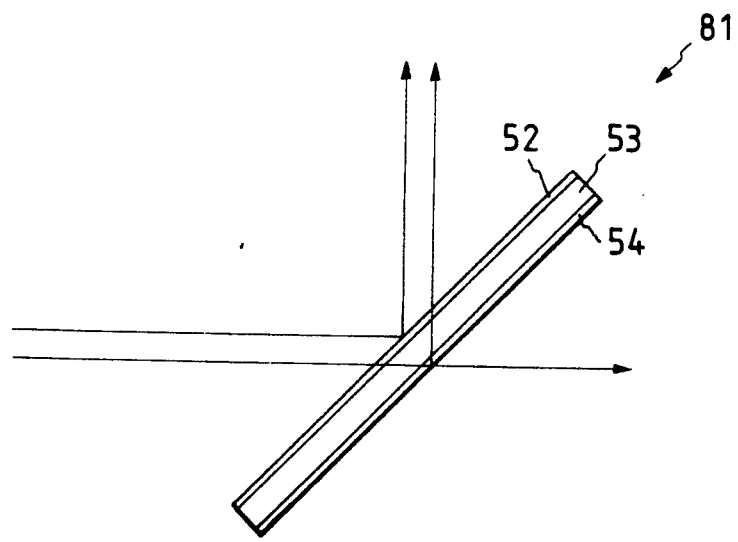
FIG. 46 is a front view of an elternative element of the polarizing beam splitter.

FIG. 45 is a front view of the polarizing beam splitter 81, for example. It comprises a combination of a perfect polarizing beam splitter 50 with a half mirror 51 for the same function as that of the polarizing beam splitter 81. As shown in FIG. 46, the polarizing beam splitter 81 may also comprise a polarizing beam splitting film 52 made of dielectric layer formed on a plate 53 of quartz or $CaF_2$ whose other surface is covered with semi-transparent film 54.

Further, a multilayer cube polarizing element, a transparent plate of Brewster's angle, a Wollaston prism, etc., can be used as the polarizing beam splitter mentioned above. In order to obtain large diameter beam for exposure, a dielectric multilayer polarization beam splitter is excellent.

Moreover, in the above-mentioned embodiments, the wavelength selection element is provided between the polarization beam splitter and the total mirror 2. However, the wavelength selection element can be provided to other position except the light path from the laser medium to the polarization beam splitter via which the output light outputted externally where the output laser beam is the most powerful light beam.

Plural Fabry-Perot etalons 6, gratings 20, or prisms 30 used in the above-mentioned embodiments can be used as an wavelength selection element or combination between the above-mentioned elements may be used. Moreover, an element combing of an wavelength selection element with a total reflection mirror, such as echelle grating or echelon grating for utilizing wavelength selection function of gratings. In the prism used in above-mentioned embodiment, a total reflection mirror may be formed on one surface thereof. Further, the number of elements can be reduced by combing function of the quarter-wave plate with that of the total reflection mirror 2, i.e., a total reflection surface is formed on one surface of a plate of $MgF_2$ or quartz phase plate. In other words, the number of elements can be reduced by using an element combining function between these elements for the above-mentioned wavelength selection element, a total reflection mirror, a quarter-wave plate, polarizing beam splitter, etc.

It is not necessary that the total reflection mirrors used in the above-mentioned embodiment have 100% reflectance but it may be a reflectance which maintains optical resonating.

As mentioned above, according to this invention, a portion polarizing light beam is taken out by polarizing beam splitter from one polarized light beam; the beam taken out is subjected to polarizing direction conversion by a polarizing conversion element and then it is amplified by the laser medium; and then amplified beam is outputted by a polarizing beam splitter. Therefore, light energy transmitted through the wavelength selection element is reduced by an inverse number of the gain of the laser medium, so that deformation or deterioration of the wavelength selection element is reduced. As a result, a narrow-band laser apparatus suitable for an exposure light source for photolithography is provided without variation of selection wavelength or decrease in output power.

What is claimed is:

1. A narrow-band laser apparatus comprising:
   (a) an optical resonator including first and second reflecting means;
   (b) laser medium provided in a light path of said optical resonator for emitting light, said laser medium including an exciting means;
   (c) polarizing beam splitting means provided between said first reflecting means and said laser medium in said light path for splitting said light into a first polarizing component as an output light and a second polarized component, said polarizing beam splitting means being arranged so as to direct said second component toward said first reflecting means;
   (d) selection means provided between said second reflecting means and said laser medium in said light path for selecting a given wavelength component from said light; and
   (e) polarizing conversion means provided between said polarizing beam splitting means and said second reflecting means in said light path for producing said first and second polarizing components in response to said light.

2. A narrow-band laser apparatus as claimed in claim 1, wherein said polarizing beam splitting means splits said light by transmitting said first polarizing component therethrough and reflecting said second polarizing component.

3. A narrow-band laser apparatus as claimed in claim 1, wherein said polarizing beam splitting means splits said light by bending said first component in one direction and by bending said second component in another direction to transmit said second component toward said first reflecting means.

4. A narrow-band laser apparatus as claimed in claim 3, wherein said selection means comprises an Wollaston prism.

5. A narrow-band laser apparatus as claimed in claim 1, wherein said selection means comprises a Fabry-Perot etalon.

6. A narrow-band laser apparatus as claimed in claim 1, wherein said selection means comprises a grating.

7. A narrow-band laser apparatus as claimed in claim 1, wherein said selection means comprises a prism.

8. A narrow-band laser apparatus as claimed in claim 1, wherein said polarized beam splitting means comprises a cube type of polarizing beam splitter.

9. A narrow-band laser apparatus as claimed in claim 1, wherein said polarizing beam splitting means comprises a polarizing beam splitting prism, a dielectric mutilayer being formed on said polarizing beam splitting prism.

10. A narrow-band laser apparatus as claimed in claim 1, wherein said laser medium comprises an excimer including noble and halogen gas.

11. A narrow-band laser apparatus as claimed in claim 1, wherein said polarizing conversion means comprises a quartz plate.

12. A narrow-band laser apparatus as claimed in claim 1, wherein said polarizing conversion means comprises a phase retarder mirror.

13. A narrow-band laser apparatus as claimed in claim 1, wherein a phase retarder prism having a surface covered with a reflection layer is used in place of a combination of said second reflecting means and polarizing conversion means.

14. A narrow-band laser apparatus as claimed in claim 1, wherein an echelle grating is used in place of a combination of said first reflecting means and said selecting means.

15. A narrow-band laser apparatus as claimed in claim 1, wherein an echelon grating is used in place with of a combination of said first reflecting means and said selecting means.

16. A narrow-band laser apparatus comprising:
   (a) an optical resonator including first and second reflecting means;
   (b) laser medium provided in a light path of said optical resonator for emitting light, said laser medium including an exciting means;
   (c) polarizing beam splitting means provided between said first reflecting means and said laser medium in said light path for transmitting a second polarizing component therethrough and reflecting a first polarized component of said light;
   (d) selection means provided between said first reflecting means and said polarized beam splitting means in said light path for selecting a given wavelength component from said second polarizing component of said light; and
   (e) polarizing conversion means provided between said polarizing beam splitting means and said laser medium in said light path for producing said first and second polarizing components in response to said light.

17. A narrow-band laserr apparatus comprising:

(a) an optical resonator including first and second reflecting means;
(b) laser medium provided in a light path of said optical resonator for emitting light, said laser medium including an exciting means;
(c) polarizing beam splitting means provided between said first reflecting means and said laser medium in said light path for transmitting a first polarizing component therethrough and reflecting a second polarizing component of said light, said polarizing beam splitting means bending said light path by reflecting said second polarizing component;
(d) selection means provided between said first reflecting means and said polarized beam splitting means in said light path for selecting a given wavelength component from said second polarizing component of said light; and
(e) polarizing conversion means provided between said polarizing beam splitting means and said second reflecting means in said light path for producing said first and second polarizing components in response to said light.

18. A narrow-band laser apparatus as claimed in claim 17, wherein:
said selection means comprises a Fabry-Perot etalon.

19. A narrow-band laser apparatus as claimed in claim 17, wherein:
said selection means comprises a grating.

20. A narrow-band laser apparatus as claimed in claim 17, wherein:
said selection means comprises a prism.

21. A narrow-band laser apparatus as claimed in claim 17, wherein:
said polarized beam splitting means comprises a cube type of polarizing beam splitter.

22. A narrow-band laser apparatus as claimed in claim 17, wherein:
said polarizing beam splitting means comprises a polarizing beam splitting prism, a dielectric multilayer being formed on said polarizing beam splitting prism.

23. A narrow-band laser apparatus as claimed in claim 17, wherein:
said laser medium comprises an excimer including noble and halogen gas.

24. A narrow-band laser apparatus as claimed in claim 17, wherein:
said polarizing conversion means comprises a quartz plate.

25. A narrow-band laser apparatus as claimed in claim 17, wherein:
said polarizing conversion means comprises a phase retarder mirror.

26. A narrow-band laser apparatus as claimed in claim 17, wherein:
a phase retarder prism whose one surface is covered with reflection layer is used in place of a combination of said second reflecting means and polarizing conversion means.

27. A narrow-band laser apparatus as claimed in claim 17, wherein:
an echelle grating is used in place of a combination of said first reflecting means and said selecting means.

28. A narrow-band laser apparatus as claimed in claim 17, wherein:
an echelon grating is used in place with of a combination of said first reflecting means and said selecting means.

29. A narrow-band laser apparatus comprising:
(a) an optical resonator including first and second reflecting means;
(b) laser medium provided in a light path of said optical resonator for emitting light, said laser medium including an exciting means;
(c) polarizing beam splitting means provided between said first reflecting means and said laser medium in said light path for splitting said light into a first polarizing component and a second polarized component by bending said first component in one direction and by bending said second component in another direction to transmit said second component toward said first reflecting means;
(d) selection means provided between said first reflecting means and said polarized beam splitting means in said light path for selecting a given wavelength component from said second polarizing component of said light; and
(e) polarizing conversion means provided between said polarizing beam splitting means and said second reflecting means in said light path for producing said first and second polarizing components in response to said light.

30. A narrow-band laser apparatus, comprising:
(a) an optical resonator including first and second reflecting means;
(b) laser medium provided in a light path of said optical resonator for emitting light, said laser medium including an exciting means;
(c) first polarizing beam splitting means, provided between said laser medium and said first reflecting means, for splitting said emitted light into first and second polarizing components and for transmitting a part of said first polarizing component and reflecting the rest of said first component and said second polarizing component of said light;
(d) selecting means, provided between said first reflecting means and said first polarizing beam splitting means, for selecting a predetermined wavelength component from said transmitted part of said first polarizing component;
(e) a third reflecting means for reflecting back a light ray from said first polarizing beam splitting means;
(f) polarizing conversion means, provided between said first polarizing beam splitting means and said third reflecting means, for converting said first polarizing component into second polarizing component in response to said light ray; and
(g) second polarizing beam splitting means, provided between said laser medium and said second reflecting means in said light path, for reflecting a first polarizing component toward said second reflecting means and transmitting said second polarizing component as output light.

31. A narrow-band laser apparatus as claimed in claim 30, wherein said laser medium comprises an excimer including noble and halogen gases.

32. A narrow-band laser apparatus as claimed in claim 30, wherein said polarizing conversion means comprises a quartz plate.

33. A narrow-band laser apparatus as claimed in claim 30, wherein said polarizing conversion means comprises a phase retarder mirror.

34. A narrow-band laser apparatus as claimed in claim 30, wherein an echelle grating is used in place with of a combination of said first reflecting means and said selecting means.

35. A narrow-band laser apparatus as claimed in claim 30, wherein an echelon grating is used in place of a combination of said first reflecting means and said selecting means.

36. A narrow-band laser apparatus as claimed in claim 30, wherein said first polarizing beam splitting means comprises a polarizing beam splitter and a half mirror.

37. A narrow-band laser apparatus as claimed in claim 30, wherein a phase retarder prism whose one surface is covered with a reflection layer is used in place of a combination of said third reflecting means and polarizing conversion means.

38. A narrow-band laser apparatus, comprising:
(a) an optical resonator including first and second reflecting means;
(b) laser medium provided in a light path of said optical resonator for emitting light, said laser medium including an exciting means;
(c) first polarizing beam splitting means, provided between said laser medium and said first reflecting means, for splitting said emitted light into first and second polarizing components and for relecting a part of said first polarizing component and transmitting the rest of said first component and said second polarizing component of said light, said first polarizing beam splitting means bending said light path by reflecting said relected part of said first polarizing component;
(d) selecting means, provided between said first reflecting means and said first polarizing beam splitting means, for selecting a given wavelength component from said reflected part of said first polarizing component;
(e) a third reflecting means for reflecting a light ray transmitted through said first polarizing beam splitting means;
(f) polarizing conversion means, provided between said first polarizing beam splitting means and said third reflecting means, for converting said first polarizing component into second polarizing component in response to said light ray; and
(g) second polarizing beam splitting means, provided between said laser medium and said second reflecting means in said light path, for transmitting a first polarizing component and reflecting said second polarizing component as output light.

39. A narrow-band laser apparatus, comprising:
(a) an optical resonator including first and second reflecting means;
(b) laser medium provided in a light path of said optical resonator for emitting light, said laser medium including an exciting means;
(c) first polarizing beam splitting means, provided between said laser medium and said first reflecting means, for splitting said emitted light into first and second polarizing components and for transmitting a part of said first polarizing component and reflecting the rest of said first polarizing component and said second polarizing component of said light.
(d) selecting means provided between said first reflecting means and said first polarizing bema splitting means for selecting a given wavelength component from said first polarizing component partially transmitted;
(e) a third reflecting means for reflecting back a light ray from said first polarizing beam splitting means;
(f) polarizing conversion means provided between said first polarizing beam splitting means and said third reflecting means for converting said first polarizing component into second polarizing component in response to said light ray; and
(g) second polarizing beam splitting means provided between said laser medium and said reflecting means in said light path for splitting said light into a first polarizing component and a second polarized component by bending said first component in a first direction to said second reflecting means and by bending said second component in a second direction.

40. A narrow-band laser apparatus comprising:
(a) an optical resonator including first and second reflecting means;
(b) laser medium provided in a light path of said optical resonator for emitting light, said laser medium including an exciting means;
(c) polarizing beam splitting means provided between said first reflecting means and said laser medium in said light path for splitting said light into a first polarizing component as an output light and a second polarized component, said polarizing beam splitting means being arranged so as to direct said second component toward said first reflecting means;
(d) selection means provided in said light path other than a section between said laser medium and said polarizing beam splitting means for selecting a given wavelength component from said light; and
(e) polarizing conversion means provided between said polarizing beam splitting means and said second reflecting means in said light path for producing said first and second polarizing components in response to said light.

41. A narrow-band laser apparatus comprising:
(a) an optical resonator including first and second reflecting means;
(b) laser medium provided in a light path of said optical resonator for emitting light, said laser medium including an exciting means;
(c) first polarizing beam splitting means provided between said laser medium and said first reflecting means for splitting polarizing component of said light into one another beams at a given ratio by transmitting and reflecting said first polarizing component and for reflecting a second polarizing component of said light, said first polarizing beam splitting means being arranged so as to direct said one beam toward said first reflecting means;
(d) polarizing conversion means for converting said first polarizing component of said another beam into said second polarizing component;
(e) a third reflecting means for reflecting back said second component from said polarizing conversion means, said first polarizing beam splitting means putting said second component into said light path by reflecting said second polarizing component;
(f) second polarizing beam splitting means provided between said laser medium and said second reflecting means for splitting said light into said second polarizing component as an output light and said first polarizing component, said second polarizing beam splitting means being arranged so as to direct said first component toward said second reflecting means; and
(g) selecting means for selecting a given wavelength component from said light, said selecting means being provided in said light path other than a section between said laser medium and said second polarizing beam splitting means.

* * * * *